(12) United States Patent
Englund et al.

(10) Patent No.: US 9,588,416 B2
(45) Date of Patent: Mar. 7, 2017

(54) METHODS AND APPARATUS FOR NANOFABRICATION USING A PLIABLE MEMBRANE MASK

(71) Applicants: Dirk Robert Englund, Cambridge, MA (US); Igal Bayn, Port Jeff Station, NJ (US); Luozhou Li, Upton, NY (US)

(72) Inventors: Dirk Robert Englund, Cambridge, MA (US); Igal Bayn, Port Jeff Station, NJ (US); Luozhou Li, Upton, NY (US)

(73) Assignee: Columbia University, New York, NY (US)

( * ) Notice: Subject to any disclaimer, the term of this patent is extended or adjusted under 35 U.S.C. 154(b) by 18 days.

(21) Appl. No.: 14/537,304

(22) Filed: Nov. 10, 2014

(65) Prior Publication Data

US 2015/0378261 A1 Dec. 31, 2015

Related U.S. Application Data

(60) Provisional application No. 62/017,631, filed on Jun. 26, 2014.

(51) Int. Cl.
*G03F 1/62* (2012.01)
*C09K 13/00* (2006.01)
(Continued)

(52) U.S. Cl.
CPC ............... *G03F 1/62* (2013.01); *C09K 13/00* (2013.01); *C01B 31/065* (2013.01); *C23C 14/58* (2013.01);
(Continued)

(58) Field of Classification Search
CPC .............. G03F 1/62; H01J 2237/31706; H01J 37/3171; C09K 13/00; C23C 16/50;
(Continued)

(56) References Cited

U.S. PATENT DOCUMENTS

| | | | | |
|---|---|---|---|---|
| 5,928,815 A | * | 7/1999 | Martin | ...................... G03F 1/14 430/5 |
| 6,569,575 B1 | * | 5/2003 | Biebuyck | .............. G03F 7/2002 430/22 |

(Continued)

OTHER PUBLICATIONS

D. J. Lipomi et al., Patterning the Tips of Optical Fibers with Metallic Nanostructures Using Nanoskiving, Nano Lett. 11, 632-636 (2010).

(Continued)

*Primary Examiner* — Anita Alanko
(74) *Attorney, Agent, or Firm* — Cooley LLP

(57) ABSTRACT

Apparatus for nanofabrication on an unconventional substrate including a patterned pliable membrane mechanically coupled to a membrane support structure, a substrate support structure to receive a substrate for processing, and an actuator to adjust the distance between the pliable membrane and the substrate. Nanofabrication on conventional and unconventional substrates can be achieved by transferring a pre-formed patterned pliable membrane onto the substrate using a transfer probe or non-stick sheet, followed by irradiating the substrate through the patterned pliable membrane so as to transfer the pattern on the pliable membrane into or out of the substrate. The apparatus and methods allow fabrication of diamond photonic crystals, fiber-integrated photonic devices and Nitrogen Vacancy (NV) centers in diamonds.

28 Claims, 22 Drawing Sheets

(51) Int. Cl.
| | |
|---|---|
| C23C 14/58 | (2006.01) |
| C01B 31/06 | (2006.01) |
| G01Q 80/00 | (2010.01) |
| C23C 16/48 | (2006.01) |
| C23C 16/50 | (2006.01) |
| H01J 37/317 | (2006.01) |

(52) U.S. Cl.
CPC .......... *C23C 16/483* (2013.01); *C23C 16/486* (2013.01); *C23C 16/487* (2013.01); *C23C 16/50* (2013.01); *G01Q 80/00* (2013.01); *H01J 37/3171* (2013.01); *H01J 2237/31706* (2013.01)

(58) Field of Classification Search
CPC ..... C23C 16/487; C23C 14/58; C23C 16/486; C23C 16/483; C01B 31/065; G01Q 80/00
See application file for complete search history.

(56) References Cited

U.S. PATENT DOCUMENTS

| | | | | |
|---|---|---|---|---|
| 2003/0232257 | A1* | 12/2003 | Inao | B82Y 10/00 430/5 |
| 2005/0241933 | A1* | 11/2005 | Branton | G01N 33/48721 204/192.34 |
| 2006/0286488 | A1* | 12/2006 | Rogers | B82B 3/00 430/325 |
| 2007/0146680 | A1* | 6/2007 | Inao | G03F 7/2014 355/75 |
| 2011/0268883 | A1* | 11/2011 | Haaheim | B82Y 10/00 427/256 |
| 2015/0293450 | A1* | 10/2015 | Breese | G03F 1/00 428/131 |

OTHER PUBLICATIONS

M. Trusheim, L. Li et al., Scalable Fabrication of High Purity Diamond Nanocrystals with Long-Spin-Coherence Nitrogen Vacancy Centers, Nano Lett. 14(1), pp. 32-36, 2013.
L. Li et al., Reactive ion etching: optimized diamond membrane fabrication for transmission electron microscopy, JVSTB, 31, 06FF01, 2013.
C. Peroz et al., Single digit nanofabrication by step-and-repeat nanoimprint lithography, Nanotechnology, 23, 015305, 2012.
F. Najafi, J. Mower et al., High-fidelity quantum photonics on a programmable integrated circuit, arXiv:1405.4244; Jun. 30, 2014.
M. Toyli et al, Chip-Scale Nanofabrication of Single Spins and Spin Arrays in Diamond, Nano Lett. 10, 3168 (2010).
S. Pezzagna et al, Nanoscale Engineering and Optical Addressing of Single Spins in Diamond, Small, 6, 2117-2121, (2010).
Riedrich-Moller, J. et al. One- and two-dimensional photonic crystal microcavities in single crystal diamond. Nature Nanotech. 7, 1-6 (2011).
Hausmann, B. J. M. et al. Coupling of NV centers to photonic crystal nanobeams in diamond. Nano Lett. 13, 5791-5796 (2013).
Lipson, M. Silicon photonics: An exercise in self-control. Nature Photon. 1, 18-19 (2007).
Srinivasan, K. & Painter, O. Optical fiber taper coupling and high-resolution wavelength tuning of microdisk resonators at cryogenic temperatures. Appl. Phys. Lett. 90, 031114 (2007).
Zhao, H.-Q., Fujiwara, M. & Takeuchi, S. Suppression of fluorescence phonon sideband from nitrogen vacancy centers in diamond nanocrystals by substrate effect. Opt. Express 20, 15628-15635 (2012).
Hanson, R., Gywat, O. & Awschalom, D. D. Room-temperature manipulation and decoherence of a single spin in diamond. Phys. Rev. B 74, 161203 (2006).
Carter, S. G. et al. Quantum control of a spin qubit coupled to a photonic crystal cavity. Nature Photon. 7, 329-334 (2013).

Benson, O. Assembly of hybrid photonic architectures from nanophotonic constituents. Nature 480, 193-199 (2011).
Chu, Y. et al. Coherent optical transitions in implanted nitrogen vacancy centers. Nano Lett. 14, 1982-1986 (Mar. 3, 2014).
Chou, S. Y.; Krauss, P. R.; Renstrom, P. J., Imprint lithography with 25-nanometer resolution, Science 1996, 272, 85-87.
Park, M.; Harrison, C.; Chaikin, P. M.; Register, R. A.; Adamson, D. H. Block Copolymer Lithography: Periodic Arrays of~1011 Holes in 1 Square Centimeter, Science 1997, 276,1401-1404.
Ruiz, R.; Kang, H.; Detcheverry, F. A.; Dobisz, E.; Kercher, D. S.; Albrecht, T. R.;de Pablo, J. J.; Nealey, P. F. "Density Multiplication and Improved Lithography by Directed Block Copolymner Assembly for Patterned Media at 1Tbit/n$^2$ and Beyond", Whitepaper, Nov. 2008, 1-4.
Smythe, E. J.; Dickey, M. D.; Whitesides, G. M.; Capasso, F., A Technique to Transfer Metallic Nanoscale Patterns to Small and Non-Planar Surfaces ACS Nano 2008, 3, 59-65.
Scheerlinck, S.; Taillaert, D.; Van Thourhout, D.; Baets, R., Flexible metal grating based optical fiber probe for photonic integrated circuits, Appl. Phys. Lett. 2008, 92, 031104.
Zhang, J.; Con, C.; Cui, B., Electron Beam Lithography on Irregular Surfaces Using an Evaporated Resist, ACS Nano, Mar. 26, 2014; 8, 3483-3489.
Kelkar, P.; Beauvais, J.; Lavallee, E.; Drouin, D.; Cloutier, M.; Turcotte, D.; Yang, P.;Mun, L. K.; Legario, R.; Awad, Y.; Aimez, V., Nano patterning on optical fiber and laser diode facet with dry resist, J. Vac. Sci. Technol. A 2004, 22, 743-746.
Tandaechanurat, A.; Ishida, S.; Guimard, D.; Nomura, M.; Iwamoto, S.; Arakawa, Y., Lasing oscillation in a three-dimensional photonic crystal nanocavity with a complete bandgap, Nature Photon. 2011, 5, 91-94.
Berggren, K. K.; Englund, D., On-Chip Detection of Entangled Photons by Scalable Integration of Single-Photon Detectors, arXiv:1405.4244; Apr. 18, 2014.
Bayn, I.; Chen, E.; Li, L.; Trusheim, M.; Schroeder, T.; Gaathon, O.; Lu, M.; Stein, A.; Liu, M.; Kisslinger, K.; Englund, D., Implantation of proximal NV clusters in diamond by lithographically defined silicon masks with 5 nm resolution CLEO: QELS Fundamental Science, Jun. 8-13, 2014, FW3B-2.
Ocola, L.; Stein, A. Effect of cold development on improvement in electron-beam nanopatterning resolution and line roughness, J. Vac. Sci. Technol. B 2006, 24, 3061-3065.
Ahn, M.; Heilmann, R. K.; Schattenburg, M. L., Fabrication of ultrahigh aspect ratio freestanding gratings on silicon-on-insulator wafers, J. Vac. Sci. Technol. B 2007, 25, 2593-2597.
Meitl, M. A.; Zhu, Z.-T.; Kumar, V.; Lee, K. J.; Feng, X.; Huang, Y. Y.; Adesida, I.; Nuzzo, R. G.; Rogers, J. A., Transfer printing by kinetic control of adhesion to an elastomeric stamp, Nature Mater. 2005, 5, 33-38.
Tao, Y.; Boss, J.; Moores, B.; Degen, C., Single crystal diamond nanomechanical resonators with quality factors exceeding one million, Nat. Commun., Apr. 8, 2014, 5.
Maze, J. R.; Stanwix, P. L.; Hodges, J. S.; Hong, S.; Taylor, J. M.; Cappellaro, P.; Jiang, L.; Dutt, M. V. G.; Togan, E.; Zibrov, A. S.; Yacoby, A.; Walsworth, R. L.; Lukin, M. D., Nanoscale magnetic sensing with an individual electronic spin in diamond Nature 2008, 455, 644-647.
Neu, E.; Appel, P.; Ganzhorn, M.; Miguel-Sánchez, J.; Lesik, M.; Mille, V.; Jacques, V.; Tallaire, A.; Achard, J.; Maletinsky, P., Photonic nano-structures on (111)-oriented diamond, Appl. Phys. Lett., Apr. 16, 2014, 104, 153108.
George, S. M., Atomic Layer Deposition: An Overview, Chem. Rev. 2009, 110, 111-131.
Sundaram, V. M.; Wen, S.-B., Fabrication of micro-optical devices at the end of a multimode optical fiber with negative tone lift-off EBL, J. Micromech. Microeng. 2012, 22, 125016.
Shambat, G.; Provine, J.; Rivoire, K.; Sarmiento, T.; Harris, J.; Vuckovic, Optical fiber tips functionalized with semiconductor photonic crystal cavities, J. Appl. Phys. Lett. 2011, 99, 191102-191102.
Schroder, T.; Schell, A. W.; Kewes, G.; Aichele, T.; Benson, O., Fiber-Integrated Diamond-Based Single Photon Source, Nano letters 2010, 11, 198-202.

(56) References Cited

OTHER PUBLICATIONS

Felidj, N.; Aubard, J.; Levi, G.; Krenn, J.; Hohenau, A.; Schider, G.; Leitner, A.; Aussenegg, F., Optimized surface-enhanced Raman scattering on gold nanoparticle arrays, Appl. Phys. Lett. 2003, 82, 3095-3097.

Spinicelli, P. et al. Engineered arrays of nitrogen-vacancy color centers in diamond based on implantation of CN molecules through nanoapertures, New Journal of Physics 13, 025014 (2011).

Pezzagna, S. et al. Creation of colour centres in diamond by collimated ionimplantation through nano-channels in mica. physica status solidi (a) 208, 2017-2022, doi:10.1002/pssa.201100455 (2011).

Lesik, M. et al. Maskless and targeted creation of arrays of colour centres in diamond using focused ion beam technology. arXiv:1304.6619 (2013).

* cited by examiner

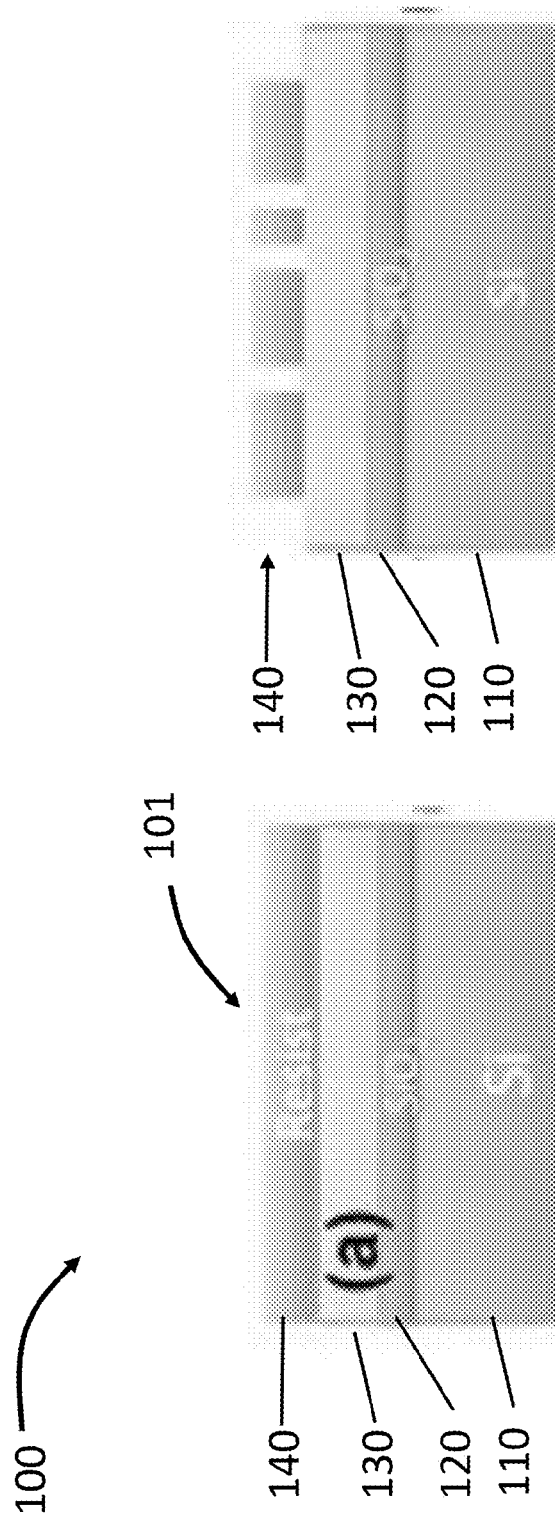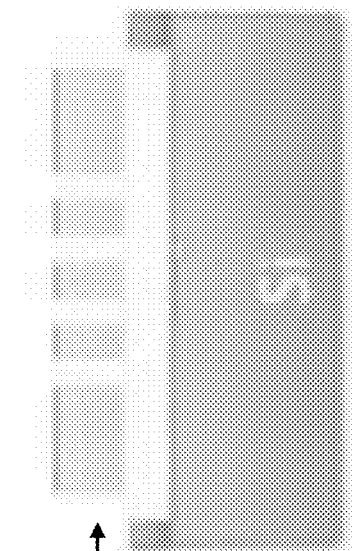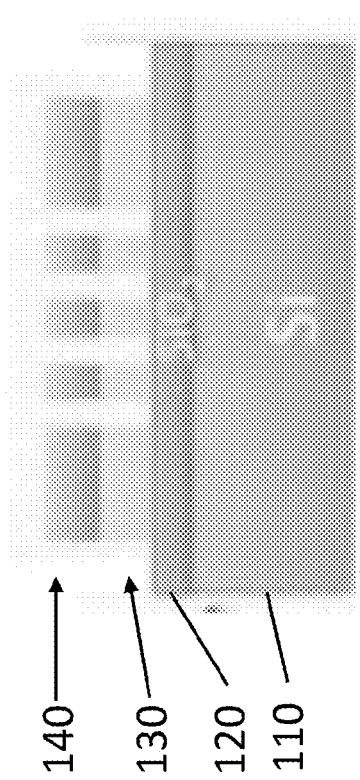
FIG. 1A
FIG. 1B
FIG. 1C
FIG. 1D

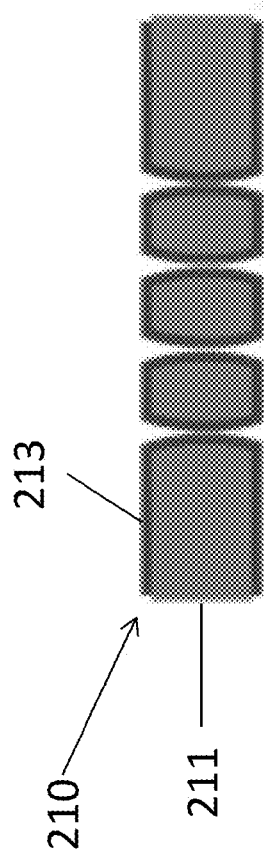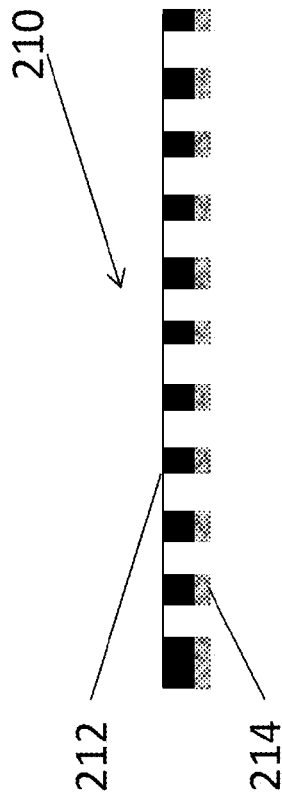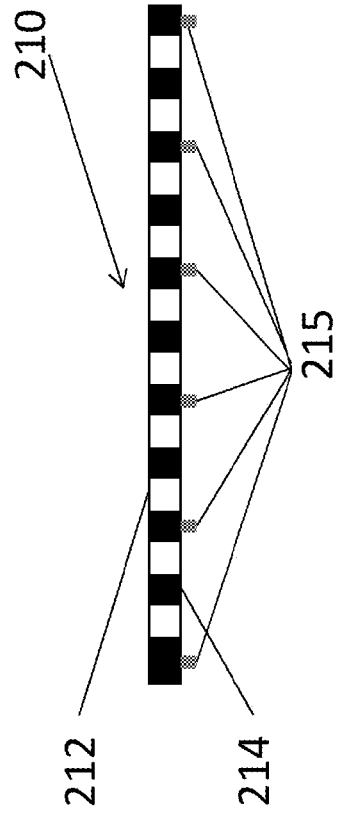

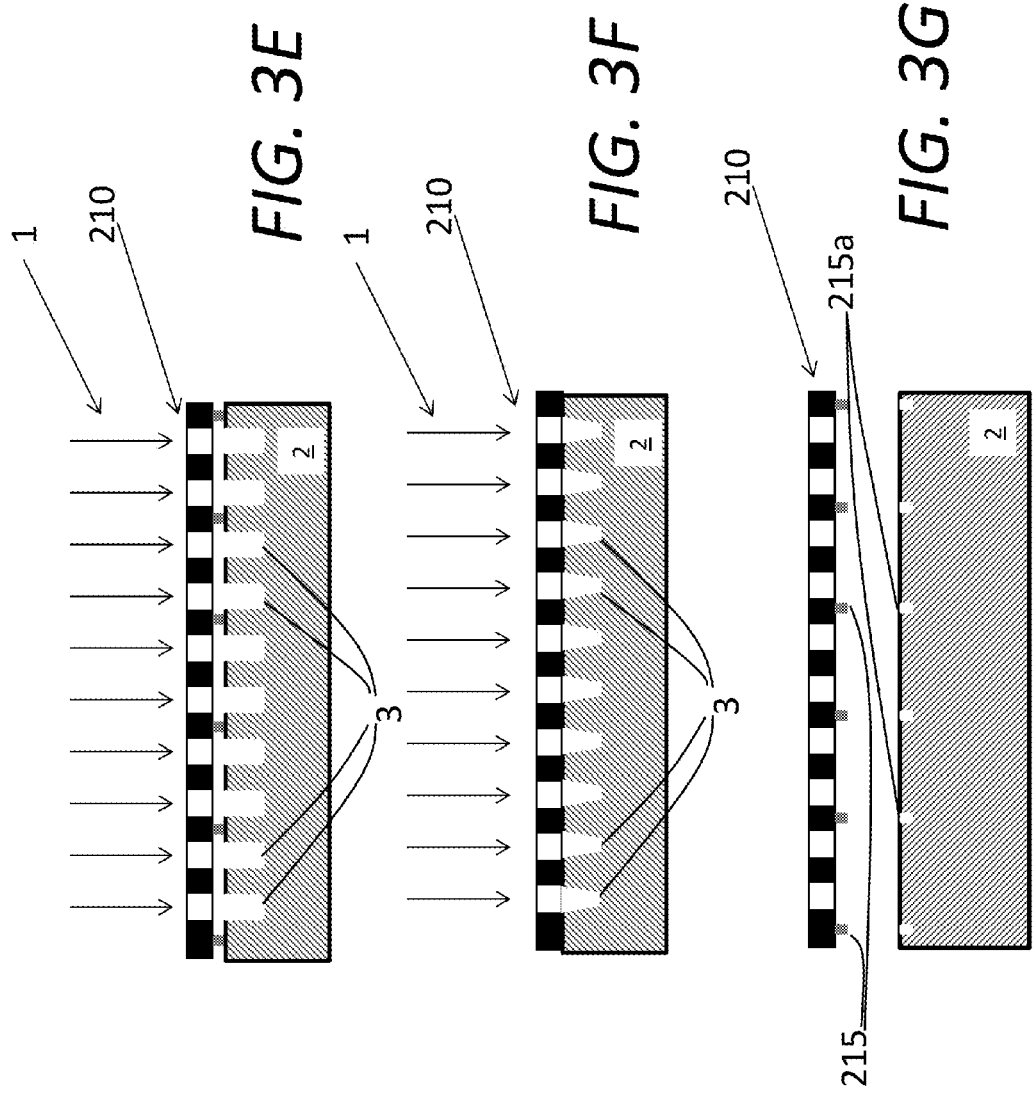

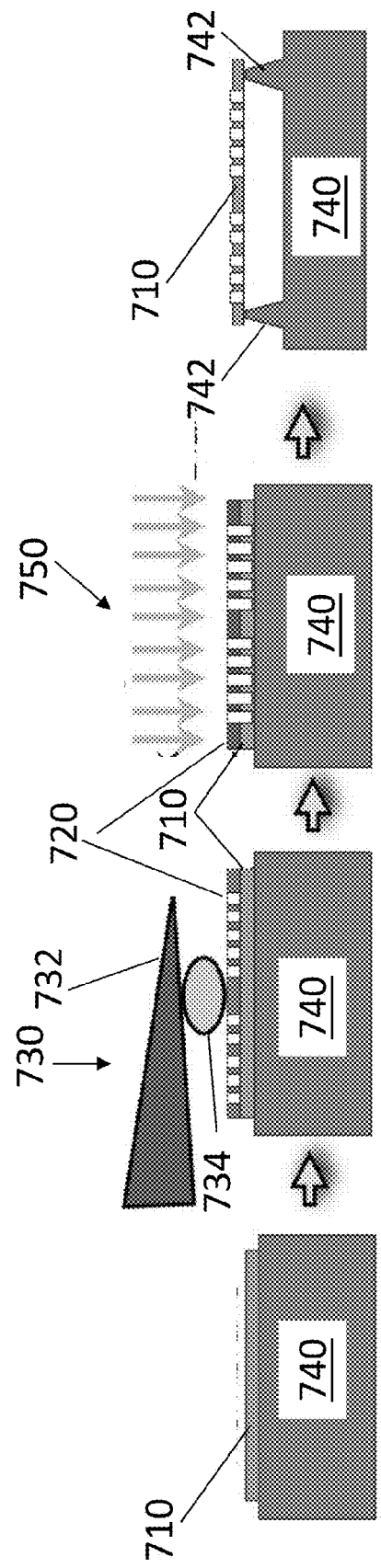

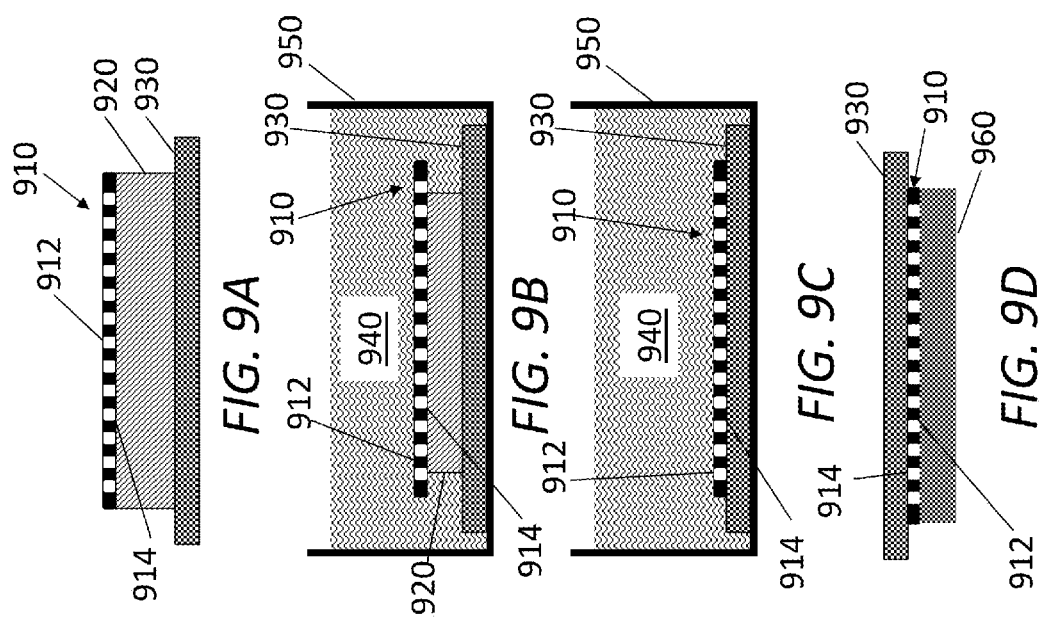

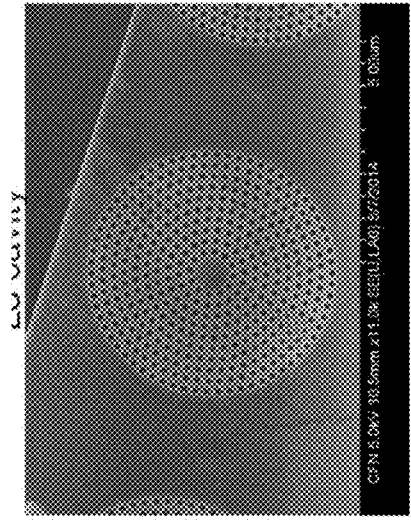
FIG. 13A Circular nanobeam cavity
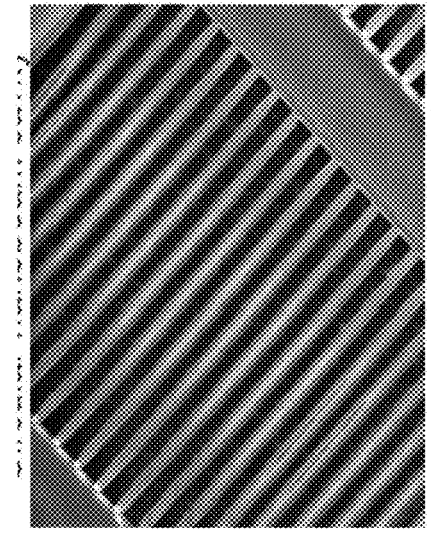
FIG. 13C Circular photonic crystal cavity
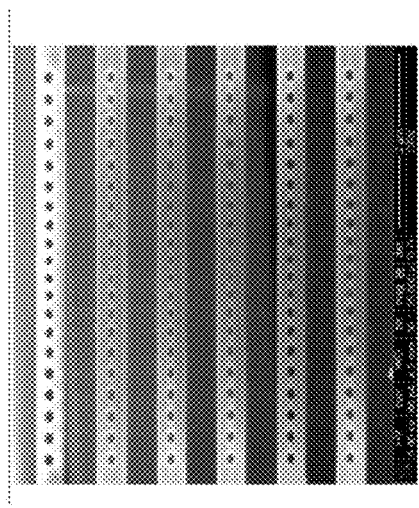
FIG. 13B Nanowire waveguide

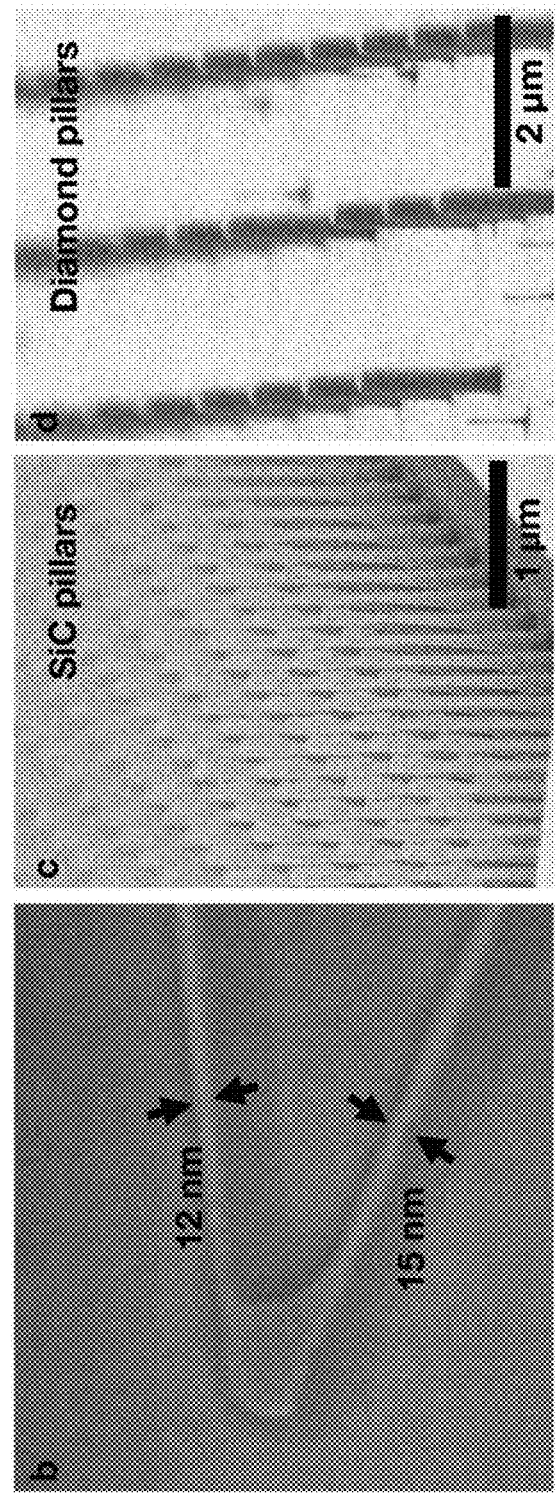

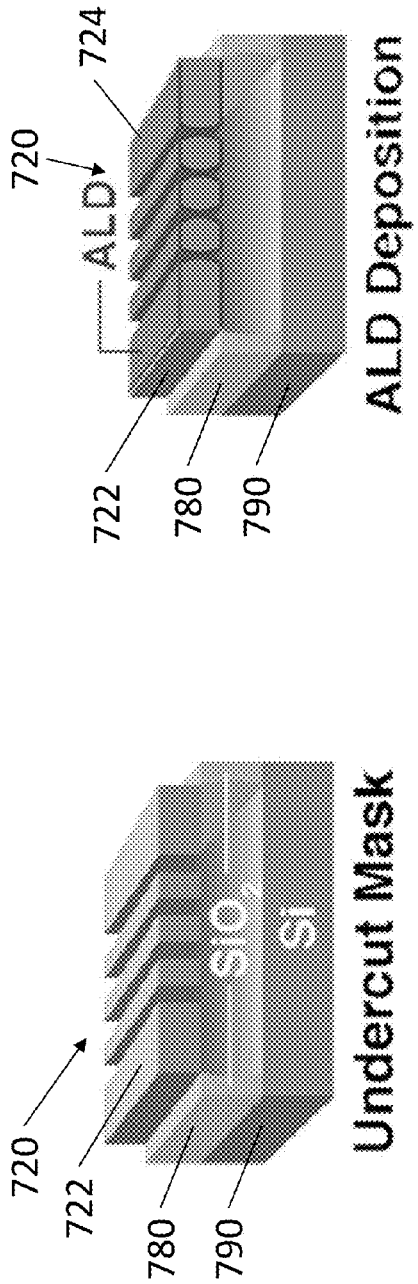
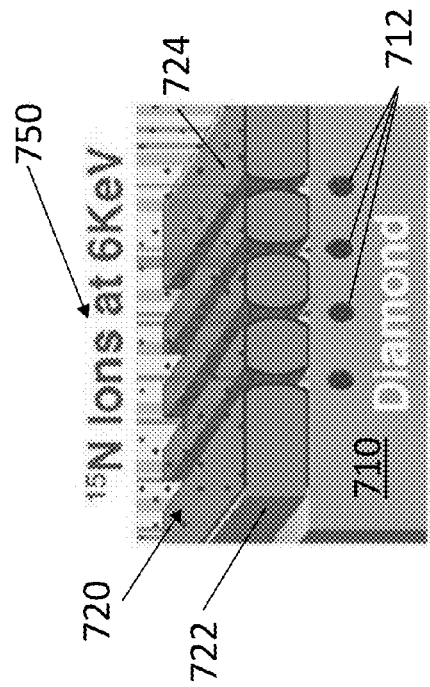
FIG. 17A Undercut Mask
FIG. 17B ALD Deposition
FIG. 17C Implantation

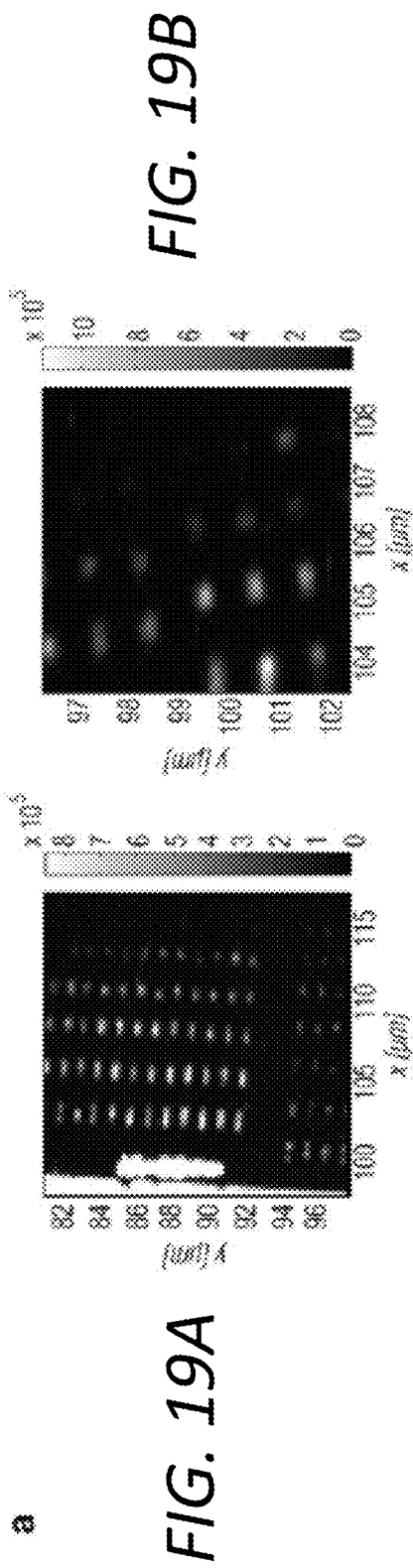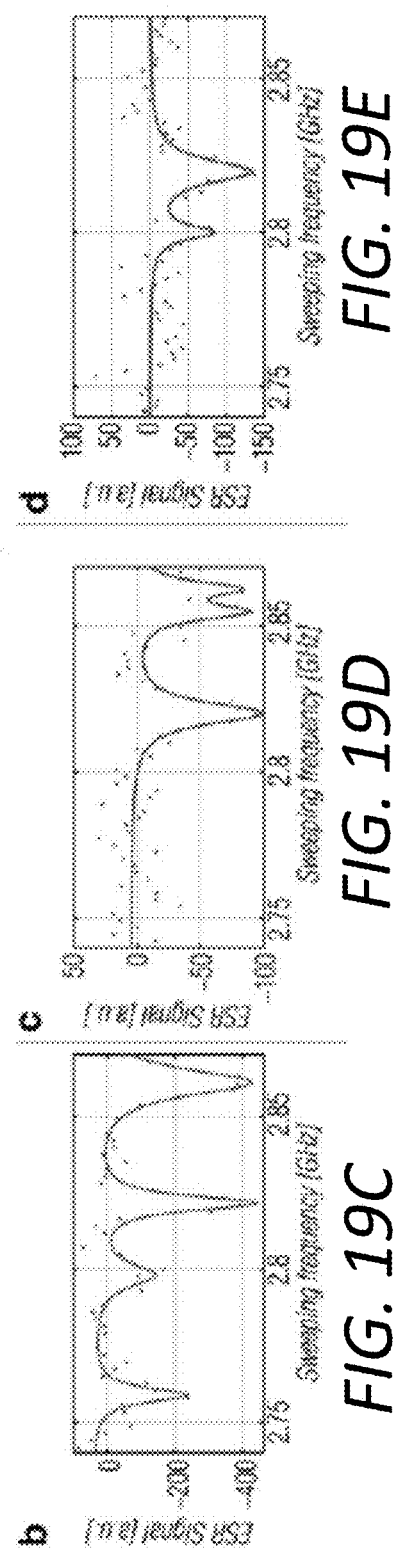
FIG. 19A  FIG. 19B  FIG. 19C  FIG. 19D  FIG. 19E

METHODS AND APPARATUS FOR NANOFABRICATION USING A PLIABLE MEMBRANE MASK

CROSS-REFERENCE TO RELATED PATENT APPLICATION

This application claims priority, under 35 U.S.C. §119(e), from U.S. Application No. 62/017,631, filed Jun. 26, 2014, and entitled "Nanoscale Ion Implantation and Precision Etching Using Conformal Contact Masks," which application is hereby incorporated herein by reference in its entirety.

GOVERNMENT SUPPORT

This invention was made with government support under Grant number FA9550-13-1-0193 awarded by the United States Air Force Office of Scientific Research and under Grant number HDTRA1-11-1-0022 awarded by the Defense Threat Reduction Agency. The government has certain rights in the invention.

BACKGROUND

The ability to define patterns on a nanometer scale has applications in chemistry, biology, medicine, electronics, optics, material science, and other fields. In top-down fabrication processing, patterns are usually first produced in a resist film by various fabrication methods, including electron-beam lithography (EBL), extreme ultraviolet lithography (EUV), nanoimprint lithography, and block copolymer lithography, among others. The patterns can then be transferred into or onto the substrate using dry etching or lift-off In these lithography techniques, normally the first step is to spin coat the resist film directly on the surface of the target substrate to be patterned. For spin-coating to work properly, surfaces should be flat at least on a millimeter scale. However, in a wide variety of emerging fields, for example, quantum photonics or fiber-integrated photonics, it is difficult to produce uniformly flat target substrates (e.g., diamond membranes or fiber facets), thereby rendering it challenging to fabricate high-resolution patterns on these materials using spin-coating based fabrication methods.

As a result, it can be challenging to make quantum photonic devices, which are often fabricated on 200-nm-thick diamond membranes. Generally it is hard to produce uniformly flat diamond membranes over a 100-μm scale. Also, it is inconvenient to process small diamond membranes with wet processing, such as resist coating, development, and acid etching, due to the difficulty in sample handling. In addition, the realization of high-quality photonic devices on such small diamond membranes usually involves nanometer precision, which is not easy to achieve by direct electron-beam lithography.

Several methods have been developed in recent years attempting to overcome the drawbacks of spin-coating and fabricate devices on unconventional substrates. For instance, focused ion beam (FIB) techniques can be used for nanofabrication, but FIB techniques can be slow and may result in undesired surface amorphitization, material redeposition, and gallium implantation. Several transfer methods involve moving sacrificial layers with metallic nano-patterns onto unconventional substrates, but these transfer methods lack controllable placement accuracy. Nanoimprint lithography with an ultraviolet (UV) curable resist may be applied for the fabrication of micro- or nano-patterns on the facets of optical fibers; evaporated negative resists for electron beam lithography (EBL) can be used for patterning on an atomic force microscope (AFM) cantilever and optical fiber, but they have limited resolution, e.g., about 50 nm.

SUMMARY

Exemplary embodiments of the present technology include apparatus and methods to fabricate nanoscale patterns and devices on target substrates, including target substrates that may be unsuitable for resist deposition via spin-coating, e.g., due to their uneven surfaces.

In one example, a nanofabrication apparatus includes a pliable membrane that has a first surface and a second surface, a membrane support structure, a substrate support structure, and an actuator. The pliable membrane can have a thickness from about 100 nm to about 1 μm and is patterned to selectively transmit incident radiation on its first surface so as to transfer the pattern on the pliable membrane into the target substrate. Additional layers may be coated on the pliable membrane to achieve smaller feature sizes, and/or to increase the pliable membrane's resistance to the incident radiation. The second surface of the pliable membrane may also be roughened to expedite the removal of the pliable membrane. The membrane support structure is mechanically coupled to the pliable membrane to facilitate the handling of the pliable membrane, including holding the pliable membrane in place during a fabrication procedure and moving the pliable membrane. The membrane support structure may comprise a cavity that can contain a liquid material to float the pliable membrane. The substrate support structure is disposed opposite the second surface of the pliable membrane to receive a substrate for processing. The actuator is operably coupled to at least one of the membrane support structure and the substrate support structure to adjust a distance between the two support structures so as to, for example, place the membrane on the substrate or to hold the pliable membrane above the substrate. The distance may be altered via mechanical, electromagnetic, or pure magnetic force.

Another example of the disclosed technology is a nanofabrication method. The method can start from providing a target substrate that can be unconventional in a sense that the surface of the target substrate is uneven (e.g. rough and/or curved). A pre-formed pliable membrane, which can have a thickness from about 100 nm to about 1 μm, is then disposed on the target substrate. The pliability of the membrane allows a conformal contact between the membrane and the possibly uneven surface of the target substrate. The pliable membrane is patterned to selectively transmit incident radiation to function as a mask. Once the target substrate and the mask are in position, a radiation source selectively irradiates the surface of the target substrate via the pliable membrane. Suitable radiation sources include, but are not limited to ultraviolet light sources and particle radiation sources, including vapor sources, plasma sources, ion beam sources, and electron beam sources.

The pre-formed pliable membrane can be disposed on the target substrate using at least two methods. The first method involves a tungsten probe with an adhesive material such as Polydimethylsiloxane on the probe's tip. The probe is lowered slowly onto the pliable membrane, causing the adhesive material to temporarily bond the pliable membrane to the probe tip. The probe is then lifted quickly to move the pliable membrane. Then the probe is lowered together with the pliable membrane onto the target substrate, and rotated with respect to the target substrate to release of the pliable membrane onto the target substrate. In a second method, a non-stick sheet made of, for example, polytetrafluoroethylene, is disposed beneath a membrane support structure that supports the pre-formed pliable membrane. Etching away the membrane support structure causes the pliable membrane to fall onto the non-stick sheet. Then the pliable membrane can be disposed on the target substrate by aligning the non-stick sheet with the target substrate and pressing down to release the pliable membrane from the non-stick sheet onto the surface of the target substrate.

The target substrate can be a diamond membrane that has a thickness of less than 300 nm and an aspect ratio greater than 1000 (the ratio of size to thickness). A pliable membrane that comprises a silicon layer coated with another layer of Chromium or Aluminum Oxide can be disposed onto the diamond membrane as a mask. The pliable membrane can be patterned with a plurality of holes (e.g., arrayed in a periodic structure) before it is disposed on the diamond membrane. Etching the diamond membrane using oxygen plasma transfers the pattern on the pliable membrane into the diamond membrane, creating a diamond photonic crystal that can be used in optical communications or other applications.

According to another example, the target substrate can be a fiber facet on which a nanoscale photonic device can be fabricated. In this example, after the pliable membrane has been disposed on the fiber facet, a layer of metal (e.g., gold) can be selectively deposited onto the fiber facet through thermal evaporation or electron beam evaporation. The pliable membrane can then be mechanically removed using a tungsten tip, leaving the metal structure (e.g., a gold dot array) on the facet and enabling a fiber-integrated photonic device.

According to yet another example, the target substrate can be a bulk diamond with high purity. A pliable membrane that comprises a silicon base layer conformally coated with an Aluminum Oxide layer can be disposed onto the diamond. The conformal layer may reduce the aperture size on the base layer from about 50 nm to about 1 nm, thereby creating finer patterns on the target substrate. $N^{15}$ ions can then be irradiated onto the diamond through the pliable membrane, forming closely spaced Nitrogen Vacancy (NV) centers in the diamond, to create a device with applications in quantum information processing.

In yet another example, a nanofabrication mask is provided. The mask can be based on a pliable membrane made of silicon. The thickness of the membrane can be from about 100 nm to about 5 μm, and the aspect ratio can be greater than 1000. A pattern is written into the pliable membrane so that the membrane can be used to selectively transmit incident radiation onto a substrate disposed opposite the membrane from a radiation source. The pattern may include one or more apertures, each of which can have a width of about 1 nm to about 100 nm.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A-1D show a process for making a pliable membrane mask suitable for patterning conventional and unconventional substrates.

FIGS. 3A-3G show examples of pliable membranes that can be used in a nanofabrication apparatus like the one shown in FIG. 2.

FIGS. 7A-7F show a method of nanofabrication using pliable membranes, probe tips, and etching.

FIGS. 9A-9D show another membrane transfer method that can be used in a nanofabrication procedure like the one shown in FIGS. 7A-7F.

FIGS. 13A-13C show diamond photonic devices fabricated using the method shown in FIGS. 7A-7F.

FIGS. 16A-16C show diamond photonic devices fabricated using the method shown in FIGS. 14A-14C.

FIGS. 17A-17C show an exemplary nanofabrication method including an ion implantation step.

FIGS. 19A-19B show fluorescent images of Nitrogen Vacancy (NV) centers implanted in a diamond using a method like the one shown in FIGS. 17A-17C.

FIGS. 19C-19E show an analysis of the spacing of NV centers implanted using a method like the one shown in FIGS. 17A-17C.

DETAILED DESCRIPTION

Figure 2:
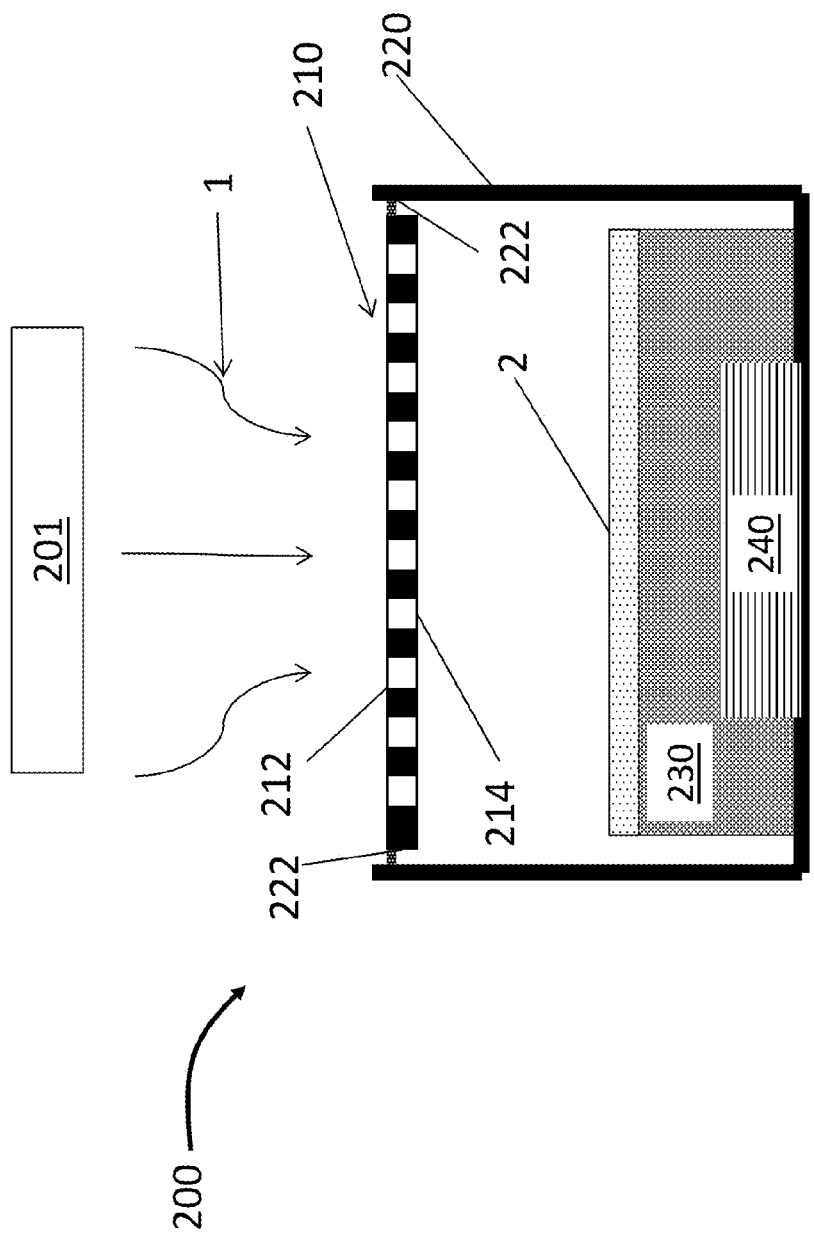
FIG. 2 shows a schematic view of a nanofabrication apparatus with a membrane support structure that holds a pliable membrane and a substrate support structure that holds a target substrate.

Disclosed herein are apparatus and methods that can be used to pattern conventional and unconventional substrates, including substrates with irregular shapes, uneven surfaces, and small areas. A pre-formed pliable membrane is used as a mask to transfer a pattern on the pliable membrane to the substrate. The membrane may be formed on a flat surface and then transferred to the substrate. The pliability of the membrane allows conformal contact between the membrane and the substrate, thereby allowing high-fidelity transfer of the pattern to the substrate even if the substrate is rough, uneven, or curved.

Pliable Membrane Masks

FIGS. 1A-1D show a process 100 of making a pliable membrane suitable for patterning conventional and unconventional substrates. In the process 100, a silicon-on-insulator (SOI) substrate 101 is first prepared, as shown in FIG. 1A. The substrate 101 includes a first silicon layer 110, a silicon oxide ($SiO_2$) layer 120, a second silicon layer 130, and a resist layer 140. The resist layer 140 can be coated over the second silicon layer 130 via, for example, spin-coating techniques, as readily understood in the art.

FIG. 1B shows a patterning step, in which a pattern (e.g., one or more apertures, slits, hole arrays, etc.) is written into the resist layer 140. The patterning can be achieved by, for example, photolithography, electron beam lithography (EBL), or nanoimprint lithography. For a photolithography process, a mask (e.g., glass with a chromium layer) can be used to filter ultraviolet (UV) radiation and achieve selective etching on the resist layer 140. EBL can utilize the wave particle duality of electron beams and create patterns in nanometer range using high energy electron beams. As an example, for 100 keV electrons, the corresponding wavelength is around 0.012 nm. Nanoimprint lithography, also known as contact printing, can be similar to photolithography except that the photomask (e.g., glass with a chromium layer) is in direct contact with the resist layer so as to make the resolution comparable to the wavelength of the UV radiation.

The SOI substrate with a patterned resist layer 140 can then undergo an etching step, as shown in FIG. 1C, so as to transfer the pattern on the resist layer 140 into the second silicon layer 130. The etching step can be, for example, reaction ion etching (RIE), in which chemically reactive plasmas can be employed to selectively remove materials. The plasmas can be created by an electromagnetic field (e.g., radio frequency waves) in gases. Different gases can be used to remove different materials. For example, silicon can be etched by plasmas created from a combination of $O_2$, and $SF_6$, or a combination $HB_r$, $Cl_2$, and $O_2$. To remove silicon dioxide, a gas mixture of $CF_4/O_2$ or $CF_4/CHF_3/Ar$ can be used.

FIG. 1D shows a step in which the resist layer 140 and the silicon oxide layer 120 are substantially removed so as to prepare the patterned second silicon layer 130 for further use. The resist layer 140 can be removed by solvents such as acetone, trichloroethylene (TCE), phenol-based strippers (e.g., Indus-Ri-Chem J-100), methyl ethyl ketone (MEK), $CH_3COC_2H_5$, methyl isobutyl ketone (MIBK), $CH_3COC_4H_9$, or any other solvents known in the art. The silicon oxide layer 120 beneath the second silicon layer 130 can be etched away via, for example, chemical undercutting using hydrofluoric (HF) acid, which reacts with silicon oxide but not silicon. After this step, the patterned second silicon layer 130, hereinafter referred to as a pliable membrane, can then be transferred to a target substrate and function as a mask in subsequent fabrication processes.

Nanofabrication Apparatus Using a Pliable Membrane Mask

FIG. 2 shows a fabrication apparatus 200 according to one exemplary embodiment. The fabrication apparatus 200 includes a patterned pliable membrane 210 having a first surface 212 and a second surface 214. The pliable membrane 210 may have a thickness of about 100 nm to about 5 μm depending on the specific application; for example, the membrane may be thicker to withstand more intense radiation or longer exposure times. The first surface 212 faces incident radiation 1 that is delivered by a radiation source 201 to transfer the pattern on the pliable membrane 210 to a substrate 2. The pattern can be created on the surface of the substrate 2 (e.g., etching), or in the bulk of the substrate 2 (e.g., ion implantation), or both (e.g., deposition with diffusion). A membrane support structure 220 holds the pliable membrane 210 in place during fabrication. The pliable membrane 210 and the support structure 220 may be coupled through one or more anchor points 222, an adhesive material (not shown in the figure), or any other suitable coupling mechanism known in the art. A support structure 230 holds the substrate 2 facing the second surface 214 of the pliable membrane 210. One or more actuators 240 (e.g., electric, piezoelectric, hydraulic fluid, or pneumatic pressure actuators) are operably coupled to the membrane support structure 220, the substrate support structure 230, or both the membrane support structure 220 and the substrate support structure 230 to position the membrane support structure 220 relative to the substrate support structure 230.

The pliable membrane 210 may be made of silicon and may be formed on another substrate (not shown) using a method like the one shown in FIG. 1A-1D. The pattern on the pliable membrane can comprise at least one aperture to transmit incident radiation to the substrate 2, and the aperture may have a width of about 1 nm to about 100 nm.

The pliable membrane 210 may be formed either using the fabrication apparatus 200 or using a separate apparatus or system (not shown). Once the pliable membrane 210 has been formed, it can be attached to the membrane support structure 220. For example, the patterned pliable membrane 210 can be transferred from a flat substrate surface, where it is created, to the fabrication apparatus 200. The pliable membrane 210 can also be transferred to the fabrication apparatus 200 from an intermediate surface on which the pliable membrane 210 is disposed after it has been fabricated. The patterned pliable membrane 210 can also be created directly in the fabrication apparatus 200 on a master substrate (not shown), then secured to the membrane support structure 220. The master substrate is then removed in order to insert a target substrate 2 (e.g., diamond, lithium niobate, or silicon oxide) for processing. For example, the master substrate can be the SOI substrate 101 shown in FIG. 1A-1D. The pliable membrane 210 can be secured to the membrane support structure by, for examples, one or more anchor points. Then the silicon oxide layer can be removed by chemical etching (e.g., using HF acid), and the remaining portion can be removed mechanically, leaving the patterned silicon layer coupled to the membrane support structure 220.

The dimensions of the pliable membrane 210 may lie in a wide range depending on the target substrate. The pliable membrane 210 may have a diameter of about 1", 2", 3", 4", 5", 6", 8", 12", or 18" in order to be substantially the same as standard wafer sizes. The pliable membrane can also be larger than the target substrate 2 so as to cover the entire area of the substrate. In other situations, for example, when fabrication is performed on only a portion of the target substrate 2, the pliable membrane 210 can then be smaller than the target substrate 2.

In another example, the pliable membrane 210 may be smaller in diameter, for example in the range of millimeters or micrometers, in order to fit unconventional target substrates such as fiber facets, portions of semiconductor lasers, or diamond membranes. The pliable membrane 210 may also come in various shapes, including round, square, rectangular, or any other shape that may fit the shape of the target substrate. Or the pliable membrane 210 may be larger than the target substrate 2 so the specific portion of the surface to be processed can be covered, in which case the shape of the pliable membrane can be more flexible. The aspect ratio of the pliable membrane 210, defined as the ratio of the length or diameter to the thickness, can be greater than 10,000.

In the fabrication apparatus 200, the pliable membrane 210 may either be disposable or reusable. In one example, a new disposable pliable membrane can be transferred into the membrane support structure 220 after each fabrication cycle. In another example, the pliable membrane 210 may be resistant to the incident radiation and multiple uses of the pliable membrane are feasible. In this case, after each fabrication cycle, the fabricated substrate may be removed and a new substrate may be provided for processing, thereby realizing fast and cost-effective fabrication. The membrane may be cleaned and replaced as desired in this situation. For example, a thin layer of organic contamination may accumulate on the surface of the membrane and cause adhesive problems later in the fabrication process. A short, aggressive oxygen plasma treatment may be used to remove the organic contamination and clean the membrane.

Figure 18B:
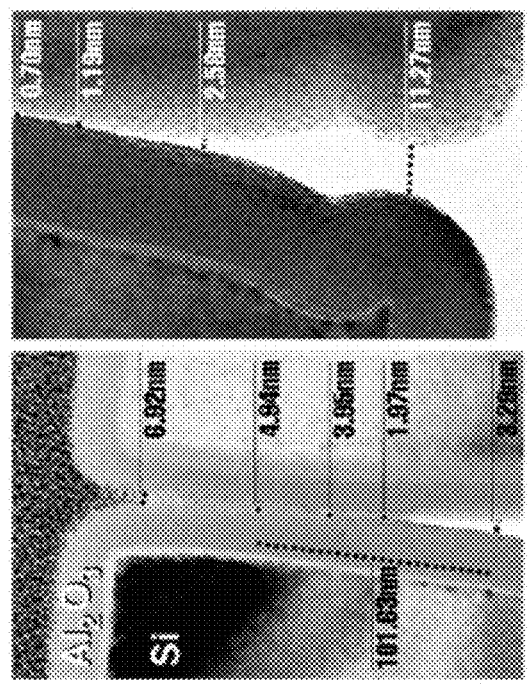
FIGS. 18A-18B show images of pliable membranes that can be used in a method like the one shown in FIGS. 17A-17C.
Figure 18A:
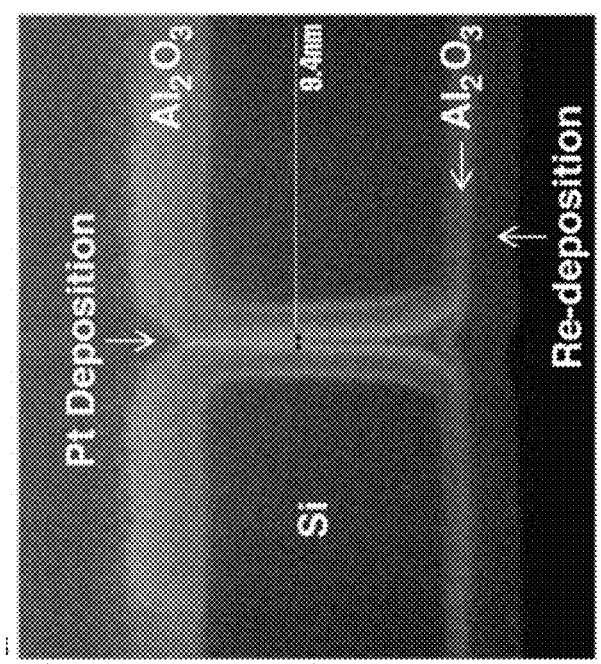

The pliable membrane 210 may comprise two layers: a base layer 211 and a coating layer 213, as shown in FIG. 3A. The base layer 211 may be made of silicon and patterned with techniques such as EBL, EUV, nanoimprint lithography, or block copolymer lithography. The coating layer 213, which can include at least one of aluminum oxide, hafnium oxide, tantalum oxide, and silicon dioxide, is conformally deposited onto the base layer 211 to decrease the feature sizes of the pattern on the membrane. In one example, the pattern on the Si base layer 211 may comprise a plurality of slits, and a coating layer 213 of $Al_2O_3$ may be conformally deposited onto the base layer and inner surfaces of the slits via an Atomic Layer Deposition (ALD) process. Using this method, a 50 nm slit in the base layer 211 can be as small as 1.2 nm, thereby allowing high-precision patterning in ion implantations (e.g., as shown in FIGS. 18A-18B, which are described in greater detail below). The depth-to-width ratio of the slit achieved in this example can be equal to or greater than 100 or equal to or greater than 300. Furthermore, this two-layer technique can be fully controllable over the feature size. For different applications, one may deposit different thickness of the coating layer 213 to achieve different feature sizes, with a precision on the order of 1 nm.

The second surface 214 of the pliable membrane 210 may be roughened, as shown in FIG. 3B, during or after the formation. In operation, the roughened surface may reduce the adhering force in the direction perpendicular to the membrane surface, thereby preventing the membrane from adhering to the substrate 2 on the substrate support structure 230. This may facilitate the removal of the fabricated substrate from the pliable membrane 210 and insertion of a new target substrate for fabrication, for example, when the pliable membrane 210 is designed to be reusable. The roughened surface may also increase the friction force that is parallel to the membrane surface between the membrane 210 and the substrate 2 to prevent lateral slipping of the membrane 210 during fabrication. The surface roughness of the second surface 214 can be from about 10 nm to about 500 nm, defined in root mean square (RMS) average of the profile height deviations from the mean line. It may be introduced by one or more of the following methods: mechanical polishing such as pumice scrubbing, chemical etching using acids to selectively corrode the surface; or reactive ion etching (RIE).

Figure 3D:
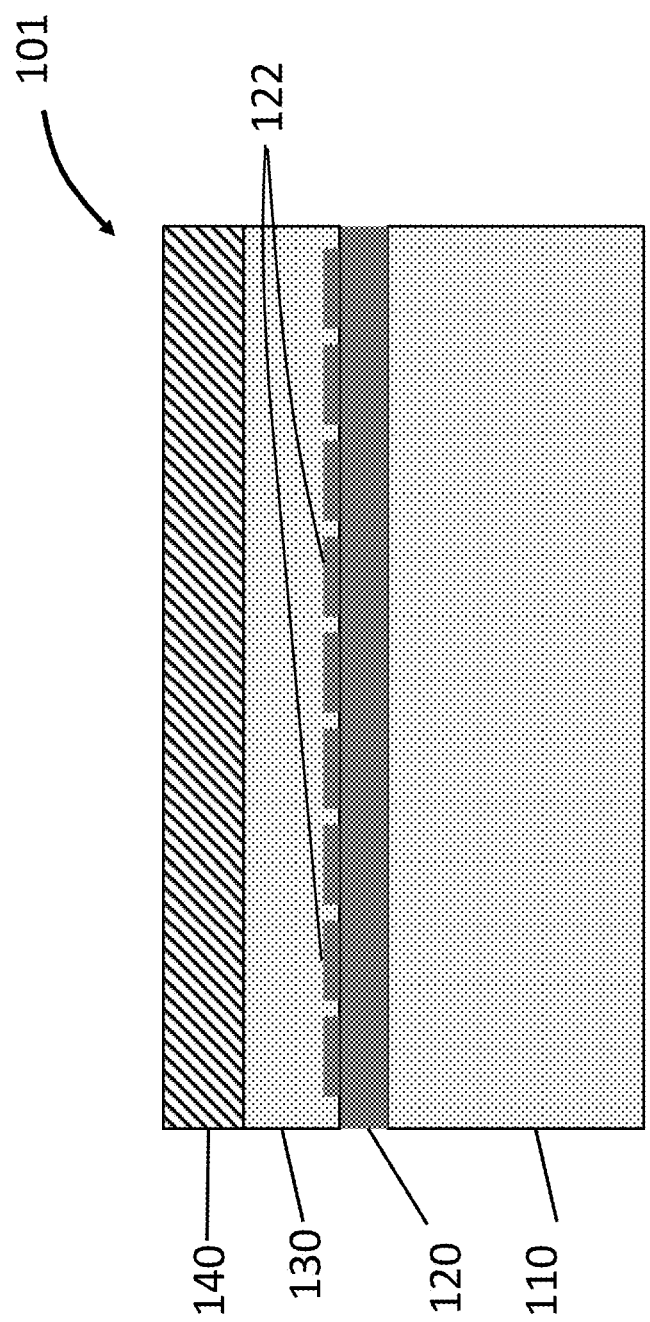

FIG. 3C shows that the pliable membrane 210 can further comprise one or more spacers 215 on the second surface 214 to support the membrane on the surface of the target substrate 2. One way to create the spacers 215 is to fabricate a corrugated silicon oxide layer 120 on the SOI substrate 101 that is used in making the pliable membrane 210. FIG. 3D shows a SOI substrate 101, in which the silicon oxide layer 120 has a plurality of projections 122 over the surface that is in contact with the second silicon layer 130. The projections 122 can be produced by, for example, selective deposition when preparing the SOI substrate. Using this SOI substrate 101 in the method illustrated in FIGS. 1A-1D, the resulting pliable membrane 210 (patterned silicon layer 130) can thus have a plurality of spacers 215, which are the "reverse tone" of the projections 122. In this method, the spacers 215 can comprise the same materials as the pliable membrane 210. Another way to produce the spacers 215 involves a deposition step after the making of the pliable membrane (e.g., after the step shown in FIG. 1D). In this way, the spacers can comprise different materials from the pliable membrane itself. For example, the spacers 215 can be produced by chemical vapor deposition (CVD) and can comprise materials including silicon, carbon fiber, silicon oxide, tungsten, silicon nitride, silicon oxynitride, or titanium nitride, among others. The height of the spacers 215 can be from about 10 nm to about 5 µm depending on the thickness of the membrane and the specific fabrication process. The number of the spacers 215 may be determined by the size of the membrane 210, the condition of the target substrate surface, and/or the desired alignment precision.

In operation, one possible use of the spacers 215 is to fabricate holes with wider straight sidewalls during etching, as shown in FIG. 3E and FIG. 3F. A suitable distance between the pliable membrane 210 and the target substrate 2, separated by the spacers 215, may help fabricate holes 3 that have inner walls substantially perpendicular to the substrate surface (FIG. 3E). In comparison, FIG. 3F shows a configuration, in which the pliable membrane 210 is in direct contact with the substrate 2. For some slow anisotropic etching techniques, the inner walls of the resulting holes may have an inverted pyramid shape. To achieve similar benefits, the spacers 215 can also be disposed on the surface of the target substrate 2 via deposition.

Another possible use of the spacers 215 is fast and accurate alignment of the pliable membrane 210 with the target substrate 2, as shown in FIG. 3G. The pliable membrane 210 can have a plurality of spacers 215 ("tenon"), and the target substrate 2 can have a plurality of holes 215a ("mortise"), which can receive the spacers 215 so as to fix the pliable membrane 210 in a desired orientation. The mapping between the spacers 215 and the holes 215a doesn't have to be one to one. In operation, two or three holes may be sufficient to fix the pliable membrane 210. After the fabrication of the target substrate 2, the holes may be used again to align the fabricated device to other devices, which can include one or more projections to fit the holes 3. This fast alignment can be especially advantageous when the target substrate is part of a photonic device (e.g., a semiconductor laser), since the fabricated device can be quickly and accurately integrated into the rest of the system.

The actuator 240 in the fabrication apparatus 200 adjusts the distance between the target substrate 2 and the pliable membrane 210. During the fabrication process, the actuator 240 brings together the target substrate 2 and the pliable membrane 210, e.g., such that the pliable membrane 210 is touching or rests upon the substrate 2 or such that the pliable membrane 210 is suspended above the substrate 2. After the fabrication, the actuator 240 may separate the target substrate from the pliable membrane in order to insert a new membrane for fabrication or to replace the disposable membrane. The actuator 240 may also separate the membrane from the substrate during fabrication, for example, to perform quality inspection.

The actuator 240 may move the membrane support structure 220 toward the substrate support structure 230, or vice versa. It is also possible to move both the membrane support structure 220 and the substrate support structure 230 at the same time.

The actuator 240 may position the membrane support structure 220 or the substrate support structure 230 through one or more of the following forces: mechanical force, electromagnetic force, magnetic force, or any other force known in the art. In one example, the actuator 240 may comprise a translation stage that may be mechanically coupled to the support structures. The translation stage can enable movement in one dimension, two dimensions, or three dimensions. For one-dimensional stages, the movement can be along the direction that is approximately perpendicular to the surface of the pliable membrane 210 so as to adjust the distance between the pliable membrane and the target substrate 2. For two-dimensional stages, an additional dimension can be approximately parallel to the surface of the pliable membrane so as to allow lateral alignment between the pliable membrane 210 and the target substrate 2. This stage position can be controlled with a precision linear actuator like an adjustment screw, micrometer head, or motorized actuator.

In another example, the actuator 240 may comprise a coil, and the membrane support structure 220 or the substrate support structure 230 may comprise a piece of magnetic material (e.g., iron, steel, nickel, cobalt, or gadolinium) that is responsive to a magnetic field. An electric current may be provided through the coil to create an electromagnetic force to move one or both of the supporting structures. In yet another example, the coil may be replaced by a permanent magnet, which can move the supporting structures by, for example, adjusting a distance between the permanent magnet and the supporting structures.

Figure 4:
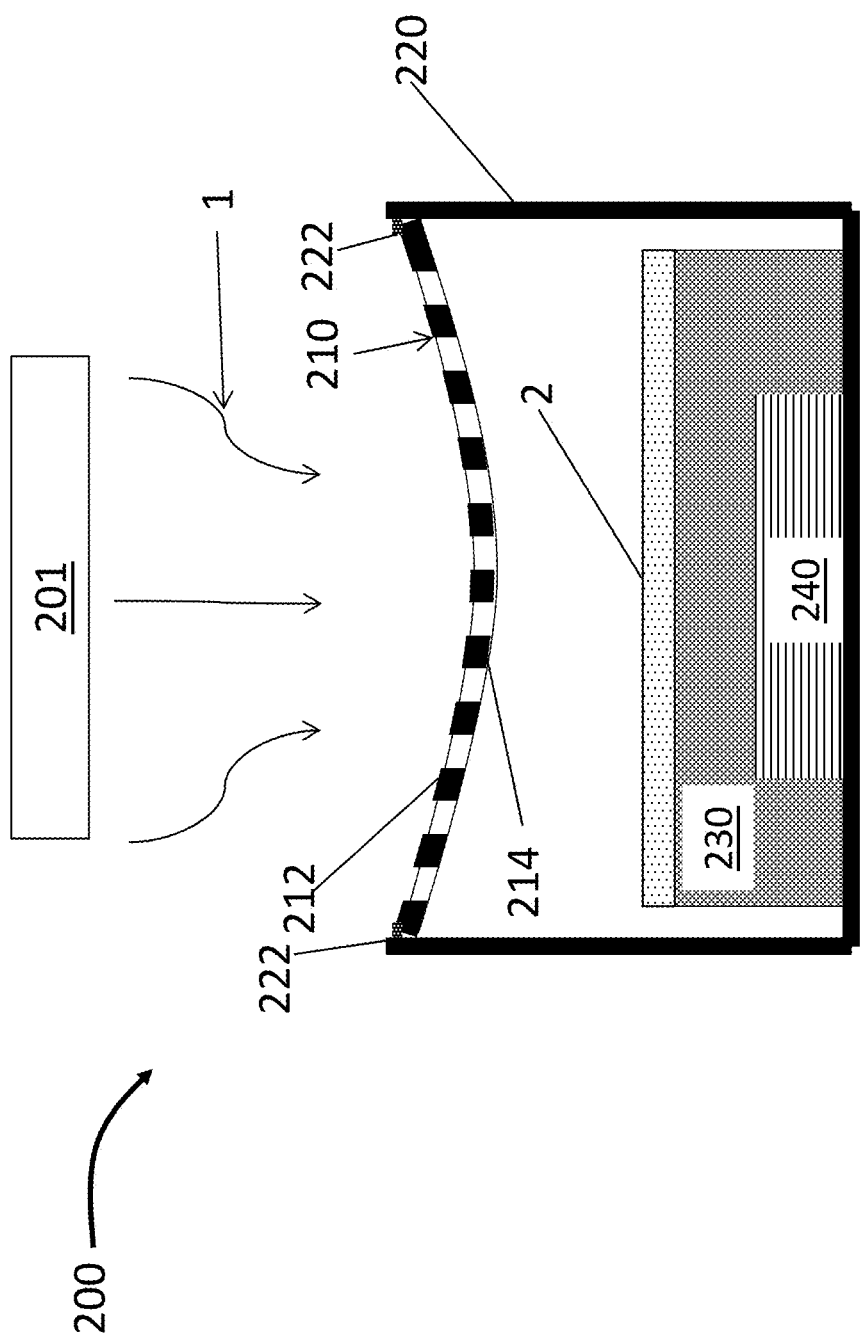
FIG. 4 shows a schematic view of a nanofabrication apparatus like the one shown in FIG. 2, with the pliable membrane curved to fit possible unconventional surfaces of target substrates.

The membrane support structure 220 may also determine or affect the pliable membrane's shape. In one exemplary embodiment, the membrane support structure 220 may hold the pliable membrane in a substantially flat state through a lateral stretching force (i.e., the membrane support structure 220 may pull pliable membrane 210 taut). In another exemplary embodiment, the pliable membrane 210 may be in curved state, as shown in FIG. 4. The curved shape of the pliable membrane 210 may be achieved by a gravitational force (i.e., the pliable membrane 210 may sag from the membrane support structure 220) or by a compressing force exerted by the membrane support structure 220 on the pliable membrane 210. In operation, when the substrate 2 and the pliable membrane 210 are brought together to be in contact with each other, the pliable membrane, due to its pliability, conforms to the shape of the substrate's surface and thereby conformally covers the substrate for fabrication.

Figure 5:
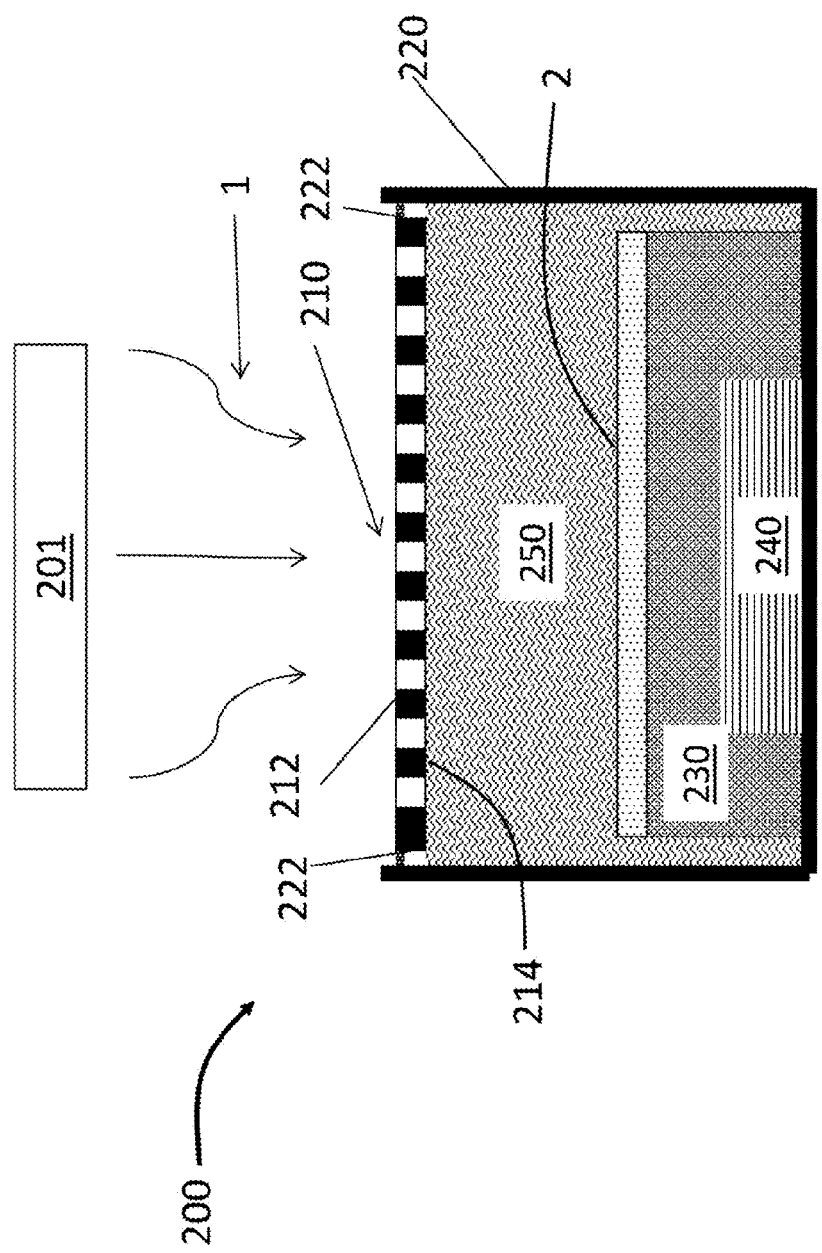
FIG. 5 shows a schematic view of a nanofabrication apparatus line the one shown in FIG. 2, except that the membrane support structure comprises a liquid to float the pliable membrane.

FIG. 5 shows a fabrication apparatus in which the membrane support structure 220 comprises a cavity that contains a liquid 250. In one example, the liquid can be water, ethanol, or isopropyl alcohol to float the pliable membrane 210. In another example, the liquid 250 may be used as part of a wet etching process; in this example the liquid may be Potassium hydroxide (KOH), Ethylenediamine pyrocatechol (EDP), Tetramethylammonium hydroxide (TMAH) or any other etching chemicals known in the art.

The liquid 250 may also be used with or instead of the actuator 240 to move the pliable membrane 210 with respect to the substrate 2. According to one example, the liquid 250 may float the pliable membrane 210 down to the target substrate for fabrication and float the membrane up after the fabrication. According to another example, the liquid 250 may float the substrate support structure 230 or the substrate 2 to adjust their positions relative to the pliable membrane 210. The floating can be adjusted by, for example, changing the liquid level. The density of the liquid 250 may also be tuned, for example by adding salt, to match the density of the pliable membrane 210, the substrate support structure 240, or the substrate itself to provide sufficient floating force. The actuating function of the liquid 250 may be used alone or in combination with other mechanisms such as mechanical, electromagnetic or magnetic actuation.

Figure 6:
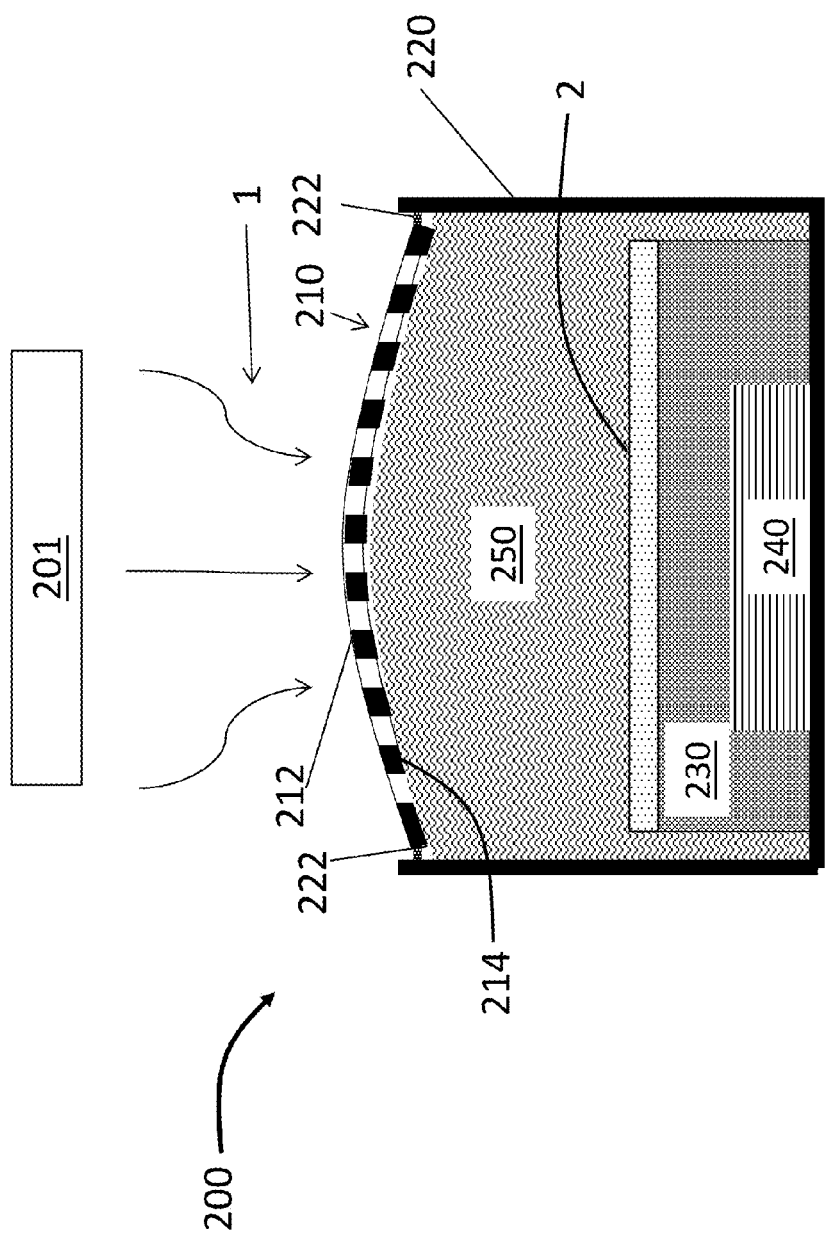
FIG. 6 shows a schematic view of a nanofabrication apparatus like the one shown in FIG. 5, within the pliable membrane curved to fit possible unconventional surfaces of target substrates.

FIG. 6 shows a nanofabrication apparatus in which the pliable membrane 210 is curved via the fluid force of the liquid 250. The curved shape may match a substrate that has a curved surface. The curvature of the pliable membrane 210 may be produced and adjusted by an actuator (not shown). The actuator can adjust the liquid level to change the shape of the pliable membrane 210. For example, lowering the liquid level below the anchor points 222 may create an inward curvature pointing toward the target substrate 2. Similarly, raising the liquid level above the anchor points may result in an outward curvature point away from the target substrate 2.

The surface curvature of the pliable membrane 210 can also be changed by tuning the relative strength between a cohesive force and an adhesive force of the liquid 250. For example, when the cohesive force of the liquid 250 is stronger than the adhesive force of the liquid 250 to the container wall, the liquid surface may concave down in order to reduce contact with the surface of the wall. The concave liquid surface can spread the pliable membrane 210 into substantially the same shape, due to the pliability of the membrane. In another example, when the adhesive force of the liquid 250 to the wall is stronger than the cohesive force of the liquid 250, the liquid is more attracted to the wall, creating an upward concavity and accordingly an upward curvature for the pliable membrane 210.

The actuator can also change the shape of the pliable membrane 210 by changing the membrane support structure 220. For example, the curvature may be increased by shortening the distance between the anchor points 222.

Nanofabrication Using a Transferrable Membrane Mask

Figure 7E:
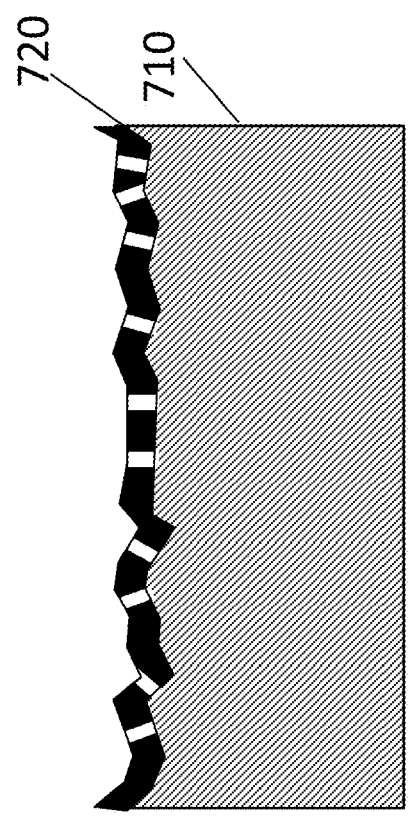

FIGS. 7A-7D show a nanofabrication method using a transferrable membrane mask 720 according to one exemplary embodiment. The method starts with a target substrate 710, which is intended to be fabricated and may be disposed on a supporting piece 740 as shown in FIG. 7A. The next step is to dispose a pre-formed pliable membrane 720 onto the target substrate 710 as shown in FIG. 7B. The pre-formed pliable membrane 720 is patterned to selectively transmit incident radiation, which can transfer the pattern on the pliable membrane 720 into the target substrate 710. The thickness of the pre-formed pliable membrane 720 may be from about 100 nm to about 5 μm depending on fabrication parameters. For example, the membrane 720 may be thicker to withstand stronger radiation or a longer exposure time.

After the pre-formed pliable membrane 720 and the target substrate 710 are in position, a radiation source (not shown) irradiates the pre-formed pliable membrane 720 with radiation 750 so as to selectively irradiate a surface of the target substrate and create desired patterns as shown in FIG. 7C. In this step, the pre-formed pliable membrane 720 functions as a mask. The radiation 750 may comprise electromagnetic radiation, charged particle radiation, or neutral particle radiation to create patterns on the target substrate 710. Electromagnetic radiation may comprise, for example, soft X-rays from soft X-ray lasers, high harmonic generation (HHG), or free electron lasers (FEL); extreme ultraviolet (EUV) radiation from excimer lasers or laser-based plasma light sources; visible and infrared light from a solid state laser; or thermal radiation. Charged particle radiation may include, for example, plasmas as used for plasma etching or deposition, ion radiation as used in ion implantation, or electron beams as used in material surface treatment. Neutral particle radiation may comprise, without limitation, metal particles for metal deposition; reactive gases such as fluorocarbons, chlorine, or boron trichloride for dry etching; neutral particle beams for surface processing; or neutron beams for material testing. The radiation 750 may also comprise a combination of more than one of the aforementioned types of radiation.

FIG. 7D shows a further step in which a portion of the supporting piece 740 is etched away such that the fabricated target substrate 710 is suspended by one or more supporting points 742. In operation, the suspension may be used to transfer and align the fabricated target substrate, which can be a photonic device, into another device or system. The supporting piece 740 and the pliable membrane 720 may comprise the same material (e.g. silicon) and can be etched away in a single etching step (e.g. SF6 plasma etching) as shown in FIG. 7D. Alternatively, the pliable membrane 720 may stay on the target substrate 710 after fabrication and be part of the fabricated device.

Figure 7F:
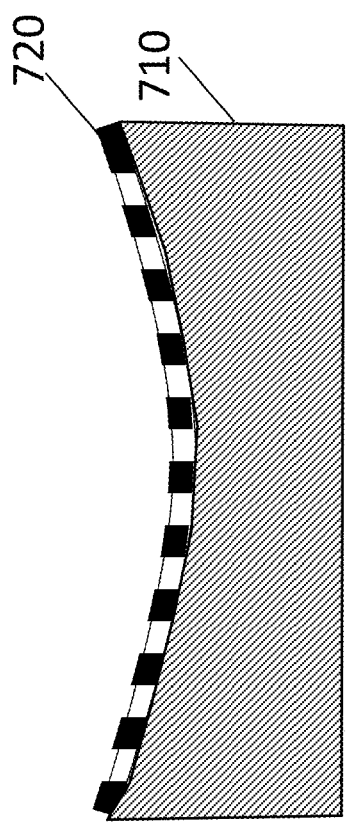

The target substrate 710 may have an unconventional surface that is challenging to spin-coat with a uniform resist film that can be patterned into a mask, thereby preventing the target substrate 710 from being patterned using conventional techniques. The unconventional surface may be rough (see FIG. 7E), for example, the RMS surface roughness of the target substrate 710 may be greater than 100 nm. The substrate's surface may also be curved as shown in FIG. 7F. For example, the surface may be spherical, cylindrical, parabolic, hyperbolic, or any other shape. The surface of the target substrate 710 may be both rough and curved, in which case spin-coating. Target substrates having an unconventional surface include but are not limited to diamond, sapphire, silicon carbide, fiber facets, and portions of semiconductor devices (e.g., semiconductor lasers, diodes, waveguides, transistors, etc.). Due to its pliability, the pliable membrane 720, when disposed onto the target substrate 710, can conformally follow the surface configuration of the target substrate 710 and therefore enable subsequent fabrication using the membrane as a mask.

The pliable membrane 720 can be fabricated on another substrate (not shown) according to methods shown in FIGS. 1A-1D. In one example, a 220-nm thick SOI substrate is spin coated with a ZEP-520A electron beam resist diluted in a solvent (e.g., diluted 1:3 in methoxybenzene) at 3000 rpm for 45 seconds, followed by baking on a hotplate at 180° C. for 3 minutes to achieve a mask layer of 60 nm. After EBL exposure in an electron beam writer (e.g., a JEOL JBX6300FS electron beam writer operating at 100 kV), the samples are developed at low temperatures (e.g., −15° C.). Both resist dilution and development at low temperature can improve the silicon pattern transfer accuracy in an Oxford Inductively Coupled Plasma (ICP) etcher (mixture of $SF_6$ and $O_2$ at −100° C.), where the silicon layer beneath the electron beam resist is patterned so as to form a pliable membrane that can used in the method 700.

Disposing the pre-formed pliable membrane 720 onto the target substrate may be achieved by at least two methods. In a first method, a transferring probe 730 that comprises an adhesive material 734 on the probe tip 732 may be employed. Lowering and pressing the transferring probe 730 onto the pliable membrane can deform the adhesive material 734 and increase the contact area between the adhesive material 734 and the membrane 720. Larger contact area leads to stronger adhering force (for example, Van de Waals force), thereby making it possible to move the pre-formed pliable membrane 720 by lifting the transferring probe 730 at a speed greater than the lowering speed. For example, the lifting speed may be greater than 1 μm/s. After the pliable membrane leaves its supporting surface, the pressing force may diminish and the adhesive material 734 tends to relax back to its previous form. Accordingly, the adhesive-membrane contact area may shrink, reducing the adhering force. To dispose the pliable membrane 720 onto the target substrate 710, the probe 730 together with the pliable membrane 720 is lowered onto the target substrate 710 and rotated so as to release the pre-formed pliable membrane 720 from the probe 730.

Figure 8B:
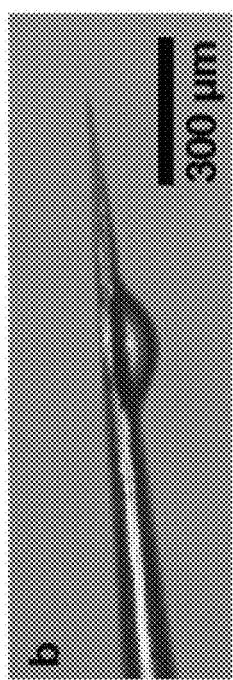
FIGS. 8A-8C show a membrane transfer method that can be used in a nanofabrication procedure like the one shown in FIG. 7A-7F.
Figure 8C:
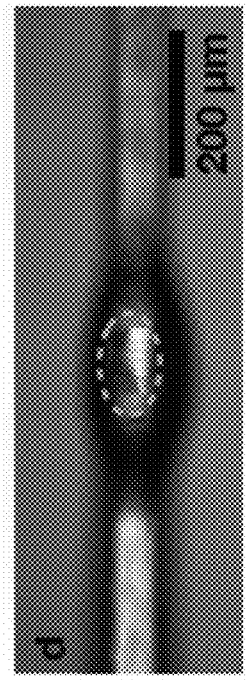
Figure 8A:
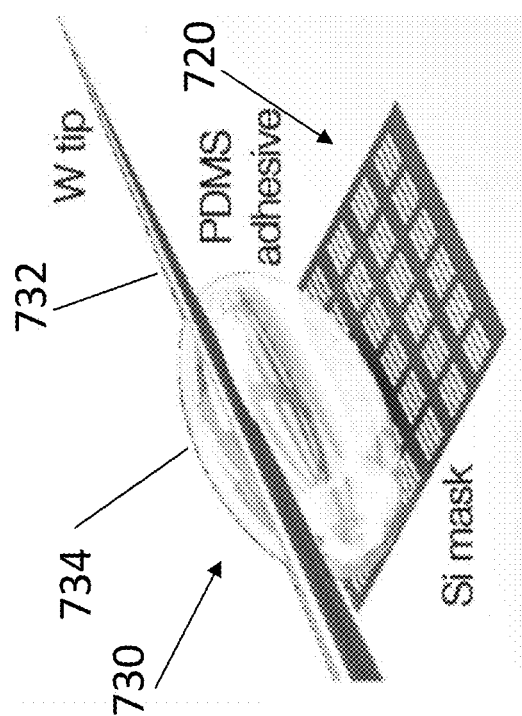

The adhesive material 734 may comprise pliable polymers such as Polydimethylsiloxane (PDMS), and the probe tip 732 may comprise tungsten, steel, glass or other materials with sufficient mechanical strength. In one example, the tip of a tungsten probe 730 with the tip radius of 0.5 μm is first dipped in an uncured PDMS gel. After the removal of the tip from the gel, a droplet of PDMS (micro-PDMS) remains attached near the sharpest point of the tip. The PDMS droplet is then blown dry in warm air and formed into a hemispherical ball attached to the tungsten tip. The PDMS hemisphere size can be controlled by adjusting the angle and the depth of the tip dipped into PDMS gel. FIG. 8A illustrates a silicon mask 720 attached with the micro-PDMS adhesive 734 on a tungsten tip 732 in air. FIG. 8B shows a photo of a transferring probe 730 that comprises a tungsten tip and a micro-PDMS adhesive. FIG. 8C shows the transferring probe 730 attached with a silicon mask 720 (marked by the dashed line).

In a second method, the pre-formed pliable membrane 720 may be transferred with a non-stick sheet 930 as shown in FIGS. 9A-9D. The non-stick sheet 930 can be disposed beneath a membrane support structure 920 on which the pliable membrane 910 is placed (FIG. 9A). In one example, the membrane support structure 920 may be the substrate on which the pliable membrane 910 is created or patterned. In another example, the membrane support structure 920 may be an intermediate surface on which the pliable membrane 910 is temporarily disposed before being transferred to the target substrate.

The next step in this transferring method is to etch away the membrane support structure 920 via, in one example, a liquid etching chemical 940 as shown in FIG. 9B. In operation, the etching chemical 940 gradually removes the membrane support structure to release the pliable membrane 910 into the etching chemical 940. As shown in FIG. 9C, the etching chemical 940 can have a density less than that of the pliable membrane 910 so the pliable membrane may sink onto the non-stick sheet 930 as the support structure 920 is etched away. In another example, however, the density of the etching chemical 940 can exceed that of the pliable membrane 910, in which case the pliable membrane 910 floats in or on the surface of the etching chemical 940. Lowering the pliable membrane 910 down to the non-stick sheet 930 may be realized by draining the etching chemical 940 out of the container 950 until the pliable membrane 910 is in contact with the non-stick sheet 930. Alternatively, the non-stick sheet can be raised to receive the pliable membrane 910. The membrane support structure 920 may comprise Silicon Oxide and the non-stick sheet 930 may comprise polytetrafluoroethylene (PTFE). The etching chemical 940 can therefore comprise hydro-fluoric (HF) acid, which can etch Silicon Oxide but not PTFE. The residual HF may be flushed away with deionized water.

In another example, the membrane support structure 920 may be etched away by a dry etching method. For example, the membrane support structure 920 may be irradiated with radiation that etches the membrane support structure 920, but not the non-stick sheet 930 nor the pliable membrane 910. As the membrane support structure 920 is removed, gravity causes the pliable membrane 910 to fall onto the surface of the non-stick sheet 930.

The next step, as shown in FIG. 9D, in this transferring method is to align the non-stick sheet 930 with a target substrate 960 and press down on the target substrate 960 to release the pliable membrane 910 onto the target substrate 960. It is also possible to press the target substrate 960 against the pliable membrane 910, in which case the assembled non-stick sheet 930 and pliable membrane 910 will be face-up as in FIG. 9C.

Figure 10:
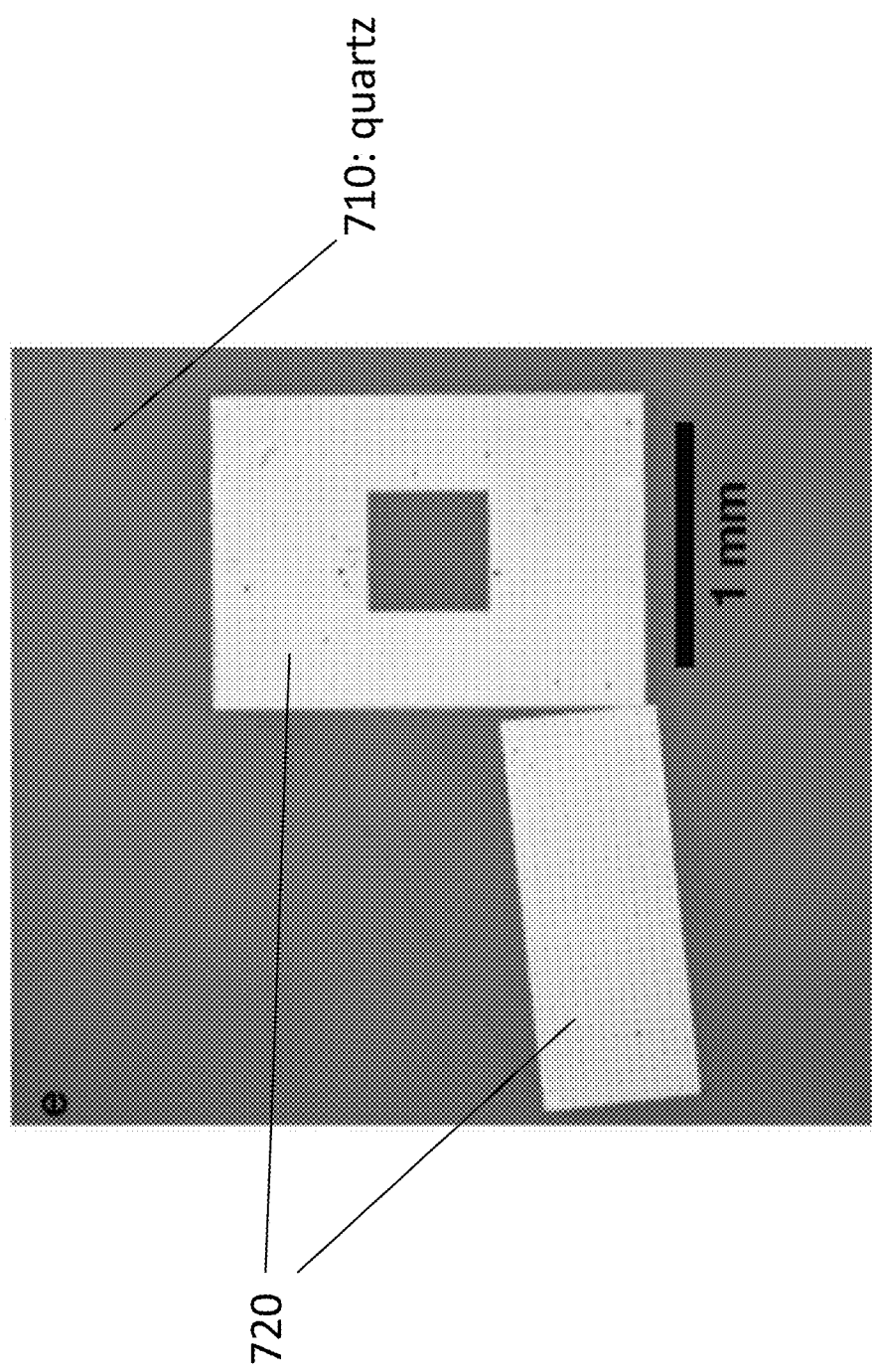
FIG. 10 is a photograph of a millimeter-scale membrane that is transferred onto a quartz piece using the membrane transferring method shown in FIGS. 9A-9 D.

FIG. 10 shows an image of two millimeter scale masks 720 transferred onto a piece of quartz 710 using a PTFE sheet (the gray background). This method may enable the transferring of much larger membranes (for example, with diameters of 1 inch to 18 inches) since the pliable membrane 910 can be lowered onto the non-stick sheet 930 in a fully controlled manner by, for example, tuning the etching speed. The non-stick sheet 930 can also be made very large (e.g., an area on the order of square meters) to hold the pliable membrane 910.

The adhering force between the pliable membrane 910 and the non-stick sheet 930 can be weaker than the adhering force between the pliable membrane 910 and the target substrate 960 to facilitate the release of the pliable membrane 910 onto the target substrate 960.

The pliable membrane 910 has a first surface 912 and a second surface 914 (see FIG. 9A-9D). The first surface 912 can be in contact with the target substrate 960 (e.g., FIG. 9D). The second surface 914 may be in contact with the supporting structure 920 and may be roughened (e.g., FIG. 3B). In operation, the roughened surface can reduce the adhering force in the direction perpendicular to the membrane surface, therefore expediting the membrane release shown in FIG. 9D. Surface roughness on the second surface 914 may be introduced by one or more of the following methods: mechanical polishing such as pumice scrubbing, chemical-etching using acids to selectively corrode the surface, or reactive-ion-etching (RIE).

Fabrication of a Diamond Photonic Crystal Using a Transferrable Membrane Mask

In one example, the target substrate can be a diamond membrane which can be fabricated into a photonic crystal or other photonic devices. Diamond photonic crystals (PC) have a wide application in emerging fields. For example, diamond PC cavities coupled to nitrogen vacancy (NV) centers could be used for quantum memories, quantum photonic processing, and sensing pressure, electromagnetic fields, and temperature. Diamond material systems also have numerous other applications in mechanics, nonlinear optics, quantum information processing, and sensing.

However, the realization of integrated PC devices on diamond membranes still faces challenges for at least two reasons. First, it is usually difficult to produce a uniformly flat diamond membrane over a 100 µm scale and therefore it is difficult to spin-coat a uniform resist film that can be patterned into a mask for further fabrication of the membrane. Second, even if spin-coating is feasible, the surface bonding between the diamond membrane and the coated film can be weak and the coated film may slip off the membrane during the spin-coating process.

The method illustrated in FIGS. 7A-7D addresses, at least in part, these challenges. Referring again to FIG. 7A, the target substrate 710 can be a diamond membrane that has a thickness of less than 300 nm and a lateral size (e.g., diameter, side length, diagonal length, etc.) from about 10 µm to about 500 µm, so the aspect ratio, which can be defined as the ratio of size to thickness, can be greater than 1000. With these dimensions, the diamond membrane tends to have a non-uniform surface that is unsuitable for spin-coating. The pre-formed pliable membrane 720 can be made of silicon using a spin-coating technique on another substrate that has a flat surface and patterned with a plurality of holes by electron beam lithography (EBL) and cryogenic etching as described above. The plurality of holes may be arrayed in a periodic structure and the period of the periodic structure can be, for example, around 200 nm.

Following the creation of the patterned pliable membrane 720, a transfer probe 730 that comprises a micro-PDMS adhesive 734 attached to a tungsten tip 732 is employed to dispose the pliable membrane 720 onto the diamond membrane 710 as shown in and described in greater detail with respect to FIGS. 8A-8C. To etch patterns on the diamond membrane 720, oxygen plasma can be used as the radiation 750. The oxygen plasma can be created, for example, via radio frequency (RF) resonance with oxygen gases as understood in the art. The silicon pliable membrane 720 can then be mechanically removed using the tungsten tip 732. An isotropic $SF_6$ plasma can be employed to etch away a portion of the silicon underneath the fabricated diamond membrane 710, now a diamond photonic crystal, so as to suspend the diamond membrane 710 above the etched surface. This method is compatible with sample sizes down to several tens of square micrometers. For example, diamond membranes having 15 µm×25 µm in area can be patterned using this method.

Figure 11:
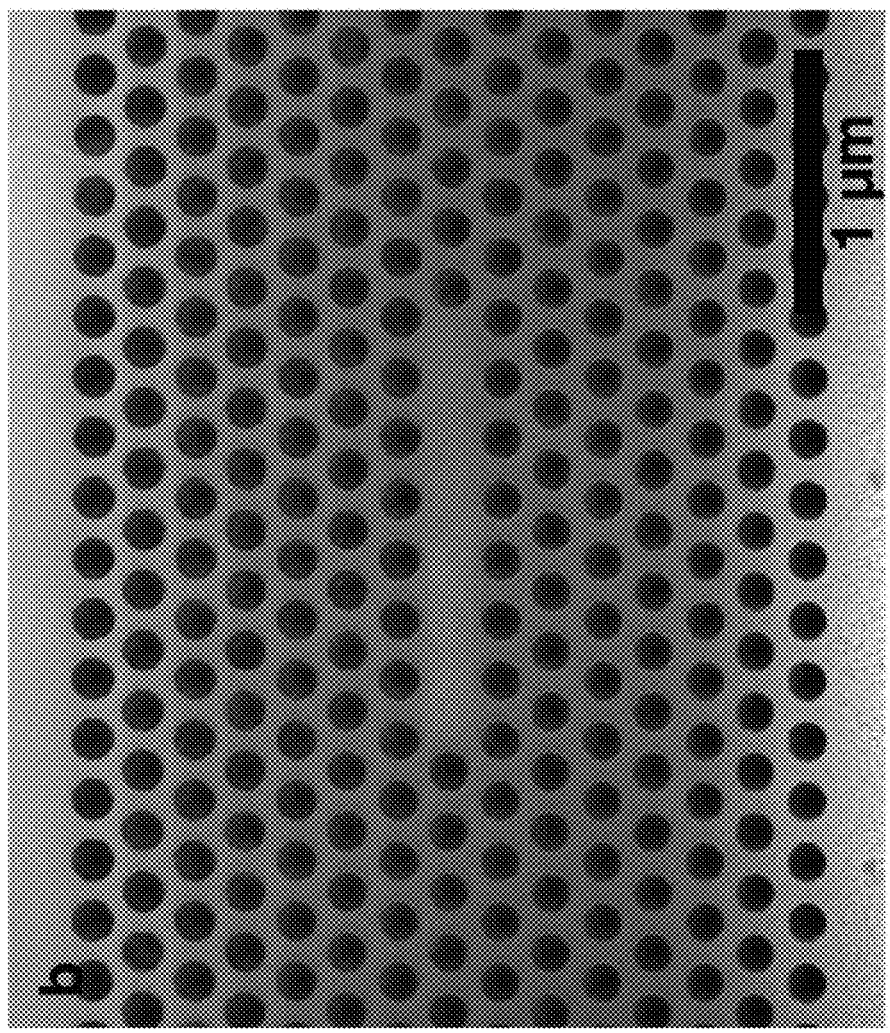
FIG. 11 shows a scanning electron microscope (SEM) image of a diamond photonic crystal fabricated using the method shown in FIGS. 7A-7F.
Figure 12:
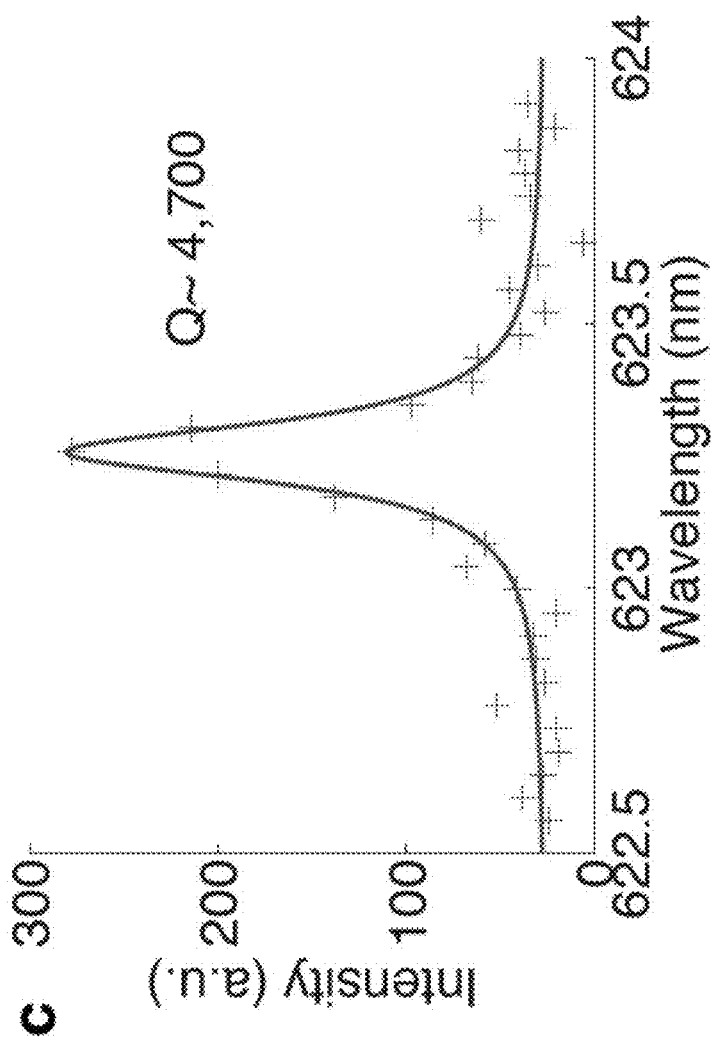
FIG. 12 is a plot of the measured transmission spectrum showing a resonance peak for a diamond photonic crystal like the one shown in FIG. 11.

FIG. 11 shows an image of a diamond photonic crystal with an L7 cavity (a PC cavity with seven missing holes) fabricated according to the method illustrated in FIG. 7A-7D. The L7 cavity is fabricated on a diamond membrane less than 300 nm thick. The diameter of the diamond membrane can be from 10 µm to 500 µm (only a portion is shown in FIG. 11). The fabricated pattern defines an array of holes with a period less than 250 nm. FIG. 12 is a plot of the measured transmission spectrum for a diamond photonic crystal like the one shown in FIG. 11. The spectrum has a sharp resonance peak at around 623.3 nm. From the transmission spectrum, the quality factor (Q) of the cavity can be derived as Q=λ/Δλ, where λ is the central wavelength of the resonance peak and Δλ is the Full Width at Half Maximum (FWHM) of the resonance peak. In FIG. 12, the resonance peak has a central wavelength of about 623.3 nm and a FWHM of about 0.13, thereby indicating a Q factor as high as 4700. A cavity with a high Q factor can, for example, operate as a narrow bandpass filter, and can be used to build on-off optical switching. The high Q factor achieve here can be attributed to, at least in part, the high fidelity of pattern transfer from the pliable membrane onto the diamond membrane.

The pliable membrane 720 can also be re-used multiple times for dry etching. In the case of oxygen plasma etching of diamond membranes, the silicon etching rate can be negligible, while typical etching rates of diamond can be 1.8 μm per hour. Experimentally, no visible change in the pliable membrane thickness is observed after 1 hour of oxygen plasma etching under normal operating conditions.

To facilitate multiple uses of the pliable membrane 720, a membrane support structure may be used to hold the membrane (e.g., as shown in FIGS. 2 and 4-6), and the fabricated diamond membrane 710, together with the supporting piece 740, can be lowered to release the diamond membrane 710 from the pliable membrane 720. Fresh diamond membranes can then be disposed onto the supporting piece and moved up toward the pliable membrane 720 for fabrication. Or the transferring probe 730 may be used to temporarily lift up the pliable membrane 720 when the fabricated diamond membrane is being removed and a new piece of diamond membrane 710 is being placed onto the supporting piece 740 for processing.

Additionally, the surface of the silicon pliable membrane 720 can be coated with one or more etch-resistant materials, such as aluminum oxide, hafnium oxide, tantalum oxide, or silicon dioxide, to further protect it from being corroded by the radiation 750, thereby extending the lifetime of the pliable membrane 720 for multiple uses. For example, Chromium deposited by electron beam or thermal evaporation can make the silicon mask more resistant to etching by fluorinated gases. Similarly, Alumina deposited by atomic layer deposition (ALD) can protect the membrane from chlorine etching.

Different patterns can be created on the pliable membrane 720 to fabricate diamond photonic crystals for various functions. FIGS. 13A-13C show several examples of diamond photonic devices that are fabricated using the above mentioned technique. FIG. 13A shows a circular nanobeam cavity of optical wavelength scale. This type of resonator can enable on-chip manipulation of photons and thus may be building blocks for optical- and quantum-communication systems. For example, these devices can be integrated side-by-side with microelectronics devices to enable fast, low-power, communication systems. FIG. 13B shows a nanowire waveguide, which can be used, for example, in single photon detection or electro-optic modulation. FIG. 13C shows a circular photonic crystal cavity that may be engineered to interact with nitrogen vacancy (NV) centers for quantum information processors.

Lift-Off and Reversal-Tone Pattering Using a Transferrable Membrane Mask

Figures 14A, 14B, 14C:
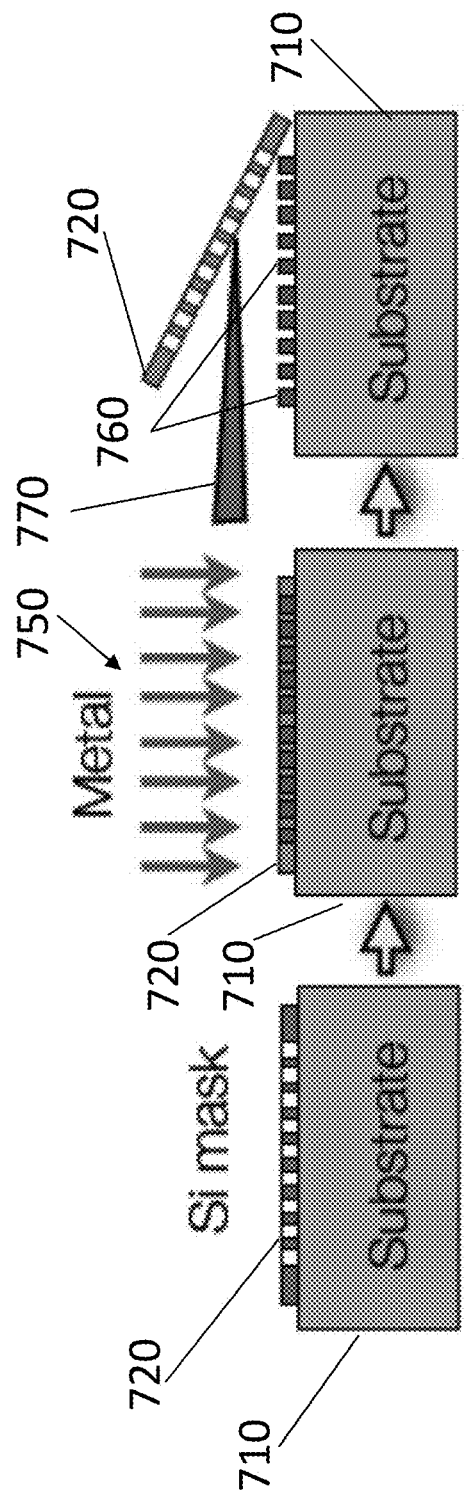
FIGS. 14A-14C show an exemplary nanofabrication method including a dry lift-off step.

FIGS. 14A-14C show a nanometer-resolution lift-off and tone-reversal pattern transfer technique using a pliable membrane 720 as a mask, which may help address the above mentioned challenges as well as challenges associated with conventional lift-off techniques. Generally, lift-off can be achieved by a solvent that dissolves the mask. If the mask is difficult to resolve, additional ultra-sonication and/or heating steps may be employed to weaken the bond between the mask and the substrate.

According to the method shown in FIGS. 14A-14C, a silicon mask 720 can be transferred from the substrate on which it is created or an intermediate surface on which it is disposed onto the target substrate 710 (FIG. 14A), which can be a fiber facet. A transfer probe (not shown here) as described before in FIG. 7 can be employed to move the pliable membrane 720. The next step is to selectively deposit a device material 760 onto the target substrate 710 as shown in FIG. 14B. The device material can be metal (e.g., gold) or dielectric (e.g., SiC or diamond) depending on the purpose of the device. The deposition may be achieved by one or more of the following techniques: thermal spray coating, physical vapor deposition (e.g., ion planting, ion implantation, sputtering or laser cladding), and chemical vapor deposition (e.g., plasma-enhanced CVD, low pressure CVD, laser-enhanced CVD, active reactive evaporation, ion beam or laser evaporation).

FIG. 14C shows the lift-off step, in which the pliable membrane 720 is removed mechanically by a tungsten tip 770, leaving a fabricated device defined by the device material 760 on the surface of the target substrate 710. This step can be straightforward and free of liquid resolving or sonication, thereby reducing the change of damaging the device.

In another example, the target substrate 710 can be a cleaved fiber facet, on which nanoscale patterns are created. Optical fibers with nanostructures integrated on their facets may have a variety of applications, such as sensing based on localized surface plasmon resonances (LSPRs), label-free detection of extremely dilute chemical and biological analytes based on surface-enhanced Raman scattering (SERS), optical filtering, and use as diffraction gratings. The small sizes and mechanical flexibility of these fiber integrated devices can allow easy insertion into small volumes that are otherwise inaccessible (e.g., the bloodstream).

For similar reasons as for the diamond membrane, it is usually challenging to pattern an optical fiber facet because of the difficulty in spin-coating the resist film. In addition, mounting optical fibers in electron-beam writers and photolithographic exposure tools also poses difficulties.

Figures 15A, 15B:
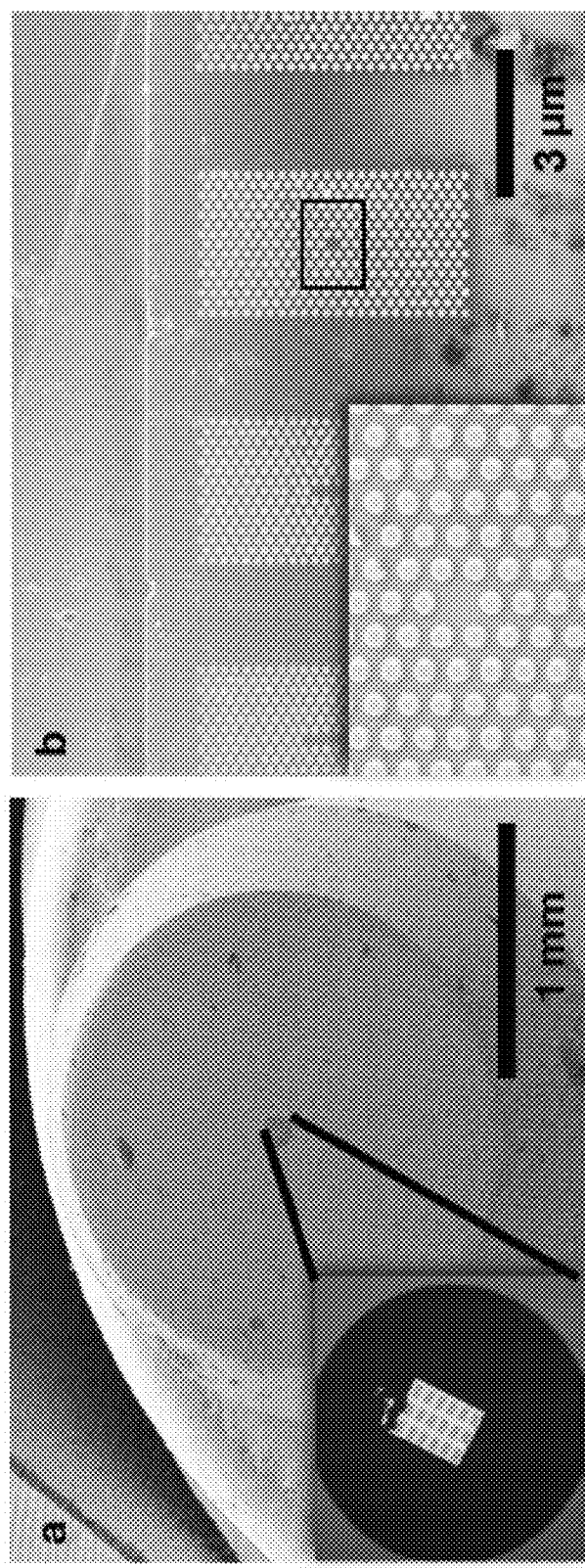
FIG. 15A shows an image of an optical fiber with a pliable membrane disposed on the fiber facet using the method shown in FIGS. 14A-14C.
FIG. 15B shows an image of a gold dot array produced using the method shown in FIGS. 14A-14C.

FIG. 15A shows an image of a silicon mask (magnified in the inset) transferred onto a fiber facet using a probe with a micro-PDMS adhesive. After the transfer, a layer of 70 nm gold is deposited and the mask is removed using a tungsten tip. The patterned gold dot arrays are shown in FIG. 15B. Using the same technique, it is also possible to create patterns on AFM cantilevers, tweezers, bottle covers, door keys, pens, and many other irregular substrates.

FIGS. 16A-16C show several other patterns that are created by a lift-off, reversal-tone patterning according to the method shown in FIGS. 14A-14C. FIG. 16A shows metal lines produced by electron beam evaporation of Chromium on a Silicon membrane, which was subsequently removed with a tungsten tip. The metal lines have a minimum width of around 12 nm—suitable for nanowires and their applications such as single photon detection. Close-up SEM images indicate a surface roughness less than 1 nm. FIGS. 16B and 16C show images of vertically standing pillars made of SiC and diamond, respectively. A surface modified with vertically standing nanostructures can enlarge surface areas comparing to flat surfaces. Incorporating such a nanostructured surface into a sensing device can increase the device's sensitivity because the active surface area is enlarged without affecting its diameter. Pillar arrays may also find use in photovoltaic cells. Highly regular, single-crystalline nanopillar arrays of optically active semiconductors on aluminum substrates can be configured as solar-cell modules. For example, a photovoltaic structure that incorporates three-dimensional, single-crystalline n-CdS nanopillars, embedded in polycrystalline thin films of p-CdTe, may enable high absorption of light and efficient collection of the carriers.

Fabrication of Nitrogen Vacancy (NV) spin-chains with transferrable silicon mask In yet another example, the target substrate 710 may comprise a bulk diamond, which can host Nitrogen Vacancy (NV) color centers—a type of defect that can be optically initialized and read-out, manipulated, and stored at room temperature for as long as 3.4 milliseconds. Because of these properties, NV centers in diamond emerge as a promising memory in quantum information processing. The NV can be formed when a nitrogen atom substituting a carbon atom in a diamond lattice is combined with a neighboring vacancy. This process may occur either during diamond growth or after post nitrogen implantation and annealing.

To scale the number of qubits, ion implantation can be a feasible technique. Ion implantation can form large arrays of NV centers in predetermined locations separated by nanometer scale spacing with high-throughput. FIGS. 17A-17C show a method of ion implantation using a transferrable membrane as the mask so as to fabricate on bulk diamond, which tends to have a surface too uneven for spin-coating to function properly.

In this method, the pliable membrane 720 can be produced on a substrate that comprises a $SiO_2$ substrate 780 supported by a Silicon substrate 790 as shown in FIG. 17A. The pliable membrane 720 can start from a spin-coated undiluted ZEP 520A e-beam resist, on which patterns can be written by electron beam lithography (EBL) followed by cryogenic etching. 49% concentrated HF acid can then be used to undercut a portion of the SiO2 substrate 780, creating a free standing pliable membrane 720.

FIG. 17B shows a deposition step in which a uniform and conformal coating 724 can be deposited to the first layer 722 of the pliable membrane 720. The conformal coating may comprise Aluminum oxide and may be coated via an ALD technique. In operation, this conformal coating can reduce the feature size of the pattern on the pliable membrane 720. For example, the pattern on the pliable membrane may comprise a plurality of slits for ion implantation. The slits may have a width around 50 nm on the first layer 722, but can be reduced to less than 1.5 nm after the conformal coating, thereby improving the implantation precision.

Then, a thin tungsten probe covered with adhesive microspheres of PDMS (not shown in FIGS. 17A-17C) can be employed to detach the pliable membrane 720 from the $SiO_2$ substrate 780 and to transfer it onto the diamond surface 710. The diamonds can be ultrapure diamond from Element Six with nitrogen concentration lower than 5 ppb. Prior to the transfer of the pliable membrane, the diamonds may be cleaned in piranha solution $H_2SO_4/H_2O_2$ (3:1).

FIG. 17C shows an implantation step, in which the diamond substrate 710 can be selectively implanted with nitrogen ($N^{15}$) at 6 keV through the pliable membrane 720. One or more NV centers 712 can thus be created at locations corresponding to the slits or other apertures on the pliable membrane 720. An example dosage of the ions can be $2 \times 10^{13}$ ions/cm$^2$. A higher dosage can be tailored to narrow the dimensions of the NV lines. After the implantation, the diamond substrate with implanted NV centers can be annealed at 800° C. in forming gas (e.g. a mixture of hydrogen and nitrogen). The pliable membrane may be mechanically removed, for example, by a tungsten tip so as to enable surface cleaning in boiling $HClO_4/HNO_3/H_2SO_4$ (1:1:1).

FIGS. 18A-18B show images of a pliable membrane 720 that comprises a silicon base layer 722 and a conformal coating layer 724. An additional layer of Platinum can be deposited to avoid re-deposition. In FIG. 18A, a test membrane covered with platinum (Pt) and cross-sectioned by Focused-Ion-Beam (FIB) is imaged by scanning electron microscopy (SEM) technique. This measurement confirms the line integrity and shows 10 nm width.

For further analysis and more precise aperture profile characterization, Transmission Electron Microscopy (TEM) may be applied. For TEM measurements, the sample membranes can be prepared from partially undercut masks. One TEM image of a pliable membrane covered by alumina is shown in FIG. 18B. The line width is varying with silicon depth reaching its narrowest point in the "waist" and widening towards the bottom and top edges of the membrane. The most narrow implantation line with a waist width of 0.7-1.2 nm is achieved with a width of around 50 nm on the base layer 722. The slit's width is below 5 nm for over 100 nm thickness in the middle of the membrane.

The resulting NV arrays can be imaged by confocal microscopy. FIG. 19A and FIG. 19B show the lines of fluorescent NVs of various length and width. The number of NVs in a line may depend on the aperture dimensions, implantation straggle, implantation dose, and conversion yield from nitrogen to NV. A probabilistic approach that combines implantation yield, electron spin resonance (ESR), and super-resolution data along with supporting information such as $g^{(2)}$ and fluorescence intensity can be adopted to estimate the line occupancy.

In FIGS. 19C-19E, lines occupied by 4-2 NVs are analyzed. The NV occupancy in the aforementioned lines is derived with certainty of 99.99%. The super-resolution imaging determines single NV positions and uncertainties by controlling the NV fluorescence rates of four uniquely addressable bulk-diamond-NV crystallographic orientations. However, only sites with four or less NVs, each with different orientations in the crystal lattice, are spatially resolvable. A line containing four NVs is shown in FIG. 19C, and the minimum distance between two near NVs is measured to be 8 nm. Comparable (9 nm) distance between two NVs is produced in 3NV line (see FIG. 19D), while for 2NV line the distance is 33 nm (see FIG. 19E).

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the coupling structures and diffractive optical elements disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the coupling structures and diffractive optical elements disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A nanofabrication apparatus comprising:
    a pliable membrane having an edge, a first surface, a second surface, and a thickness of about 100 nm to about 1 µm, the pliable membrane being patterned to selectively transmit radiation incident on the first surface;
    a membrane support structure, mechanically coupled to the edge of the pliable membrane via at least one anchor point, to hold the pliable membrane;
    a substrate support structure, disposed opposite the second surface of the pliable membrane, to receive a substrate; and
    an actuator, operably coupled to at least one of the membrane support structure or the substrate support structure, to position the membrane support structure relative to the substrate support structure,
    wherein the membrane support structure defines a cavity to hold a liquid to float the pliable membrane.

2. The nanofabrication apparatus of claim 1, wherein the pliable membrane has an aspect ratio equal to or greater than 10,000.

3. The nanofabrication apparatus of claim 1, wherein the pliable membrane comprises silicon.

4. The nanofabrication apparatus of claim 1, wherein the pliable membrane comprises:
    a first layer patterned with a plurality of slits, at least one slit having an inner surface; and
    a conformal coating layer deposited on the inner surface of the at least one slit to decrease a width of the at least one slit.

5. The nanofabrication apparatus of claim 4, wherein the first layer of the pliable membrane comprises silicon.

6. The nanofabrication apparatus of claim 4, wherein the conformal coating layer comprises at least one of aluminum oxide, hafnium oxide, tantalum oxide, and silicon dioxide.

7. The nanofabrication apparatus of claim 4, wherein the at least one slit has a minimum width of about 1.2 nm.

8. The nanofabrication apparatus of claim 4, wherein the at least one slit has a depth-to-width ration equal to or greater than 100.

9. The nanofabrication apparatus of claim 1, wherein the second surface of the pliable membrane has a surface roughness of about 10 nm to about 500 nm to prevent the second surface of the pliable membrane from adhering to the substrate.

10. The nanofabrication apparatus of claim 1, wherein the liquid comprises at least one of water, ethanol, and isopropyl alcohol.

11. A nanofabrication apparatus comprising:
    a pliable membrane having an edge, a first surface, a second surface, and a thickness of about 100 nm to about 1 µm, the pliable membrane being patterned to selectively transmit radiation incident on the first surface;
    a membrane support structure, mechanically coupled to the edge of the pliable membrane via at least one anchor point, to hold the pliable membrane;
    a substrate support structure, disposed opposite the second surface of the pliable membrane, to receive a substrate; and
    an actuator, operably coupled to at least one of the membrane support structure or the substrate support structure, to position the membrane support structure relative to the substrate support structure,
    wherein the actuator comprises a coil, electromagnetically coupled to at least one of the membrane support structure or the substrate support structure, to position the membrane support structure relative to the substrate support structure via an electromagnetic force.

12. A nanofabrication apparatus comprising:
    a pliable membrane having an edge, a first surface, a second surface, and a thickness of about 100 nm to about 1 µm, the pliable membrane being patterned to selectively transmit radiation incident on the first surface;
    a membrane support structure, mechanically coupled to the edge of the pliable membrane via at least one anchor point, to hold the pliable membrane;
    a substrate support structure, disposed opposite the second surface of the pliable membrane, to receive a substrate; and
    an actuator, operably coupled to at least one of the membrane support structure or the substrate support structure, to position the membrane support structure relative to the substrate support structure,
wherein the actuator comprises a magnet, in magnetic communication with at least one of the membrane support structure or the substrate support structure, to position the membrane support structure relative to the substrate support structure via a magnetic force.

13. The nanofabrication apparatus of claim 1, further comprising:
at least one spacer, disposed between the second surface of the pliable membrane and a substrate, to support the pliable membrane on a surface of the substrate.

14. The nanofabrication apparatus of claim 13, wherein the at least one spacer has a height of about 10 nm to about 5 μm.

15. A nanofabrication method, comprising:
A) providing a target substrate on a substrate support structure;
B) disposing a pre-formed pliable membrane onto the target substrate, wherein the pre-formed pliable membrane has an edge, a first surface, a second surface, and a thickness from about 100 nm to about 1 μm and is patterned to selectively transmit incident radiation;
C) coupling the edge of the pre-formed pliable membrane to a membrane support structure via at least one anchor point, the membrane support structure holding the pre-formed pliable membrane such that the second surface of the pre-formed pliable membrane is opposite the target substrate;
D) positioning the membrane support structure relative to the substrate support structure with an actuator operably coupled to at least one of the membrane support structure or the substrate support structure; and
E) irradiating the pre-formed pliable membrane so as to selectively irradiate a surface of the target substrate,
wherein the membrane support structure defines a cavity to hold a liquid to float the pliable membrane.

16. The nanofabrication method of claim 15 wherein B) comprises:
disposing a non-stick sheet beneath the membrane support structure;
etching away the membrane support structure so as to lower the pre-formed pliable membrane down to the non-stick sheet; and
aligning the non-stick sheet with the target substrate and pressing down to release the pliable membrane onto the target substrate.

17. The nanofabrication method of claim 16 wherein the non-stick sheet comprises polytetrafluoroethylene.

18. The nanofabrication method of claim 16, wherein the membrane support structure comprises silicon oxide.

19. The nanofabrication method of claim 15, wherein the surface of the target substrate has a surface roughness greater than 100 nm.

20. The nanofabrication method of claim 15, wherein the surface of the target substrate is curved.

21. The nanofabrication method of claim 15, wherein the target substrate comprises at least one of diamond, lithium niobate, and silicon oxide.

22. The nanofabrication method of claim 21, wherein the target substrate has a thickness less than 300 nm and an aspect ratio greater than 1000.

23. The nanofabrication method of claim 22, wherein an etch-resistant coating is deposited on the pre-formed pliable membrane to extend a lifetime of the pre-formed pliable membrane.

24. The nanofabrication method of claim 23, wherein the etch-resistant coating comprises at least one of Chromium or Aluminum Oxide.

25. The nanofabrication method of claim 15, wherein E) comprises irradiating the pre-formed pliable membrane with an ion beam so as to implant at least one ion in the target substrate.

26. The nanofabrication method of claim 15, wherein E) comprises irradiating the pre-formed pliable membrane so as to pattern the surface of the target substrate.

27. A nanofabrication method, comprising:
A) providing a target substrate on a substrate support structure;
B) disposing a pre-formed pliable membrane onto the target substrate, wherein the pre-formed pliable membrane has an edge, a first surface, a second surface, and a thickness from about 100 nm to about 1 μm and is patterned to selectively transmit incident radiation;
C) coupling the edge of the pre-formed pliable membrane to a membrane support structure via at least one anchor point, the membrane support structure holding the pre-formed pliable membrane such that the second surface of the pre-formed pliable membrane is opposite the target substrate;
D) positioning the membrane support structure relative to the substrate support structure with an actuator operably coupled to at least one of the membrane support structure or the substrate support structure; and
E) irradiating the pre-formed pliable membrane so as to selectively irradiate a surface of the target substrate,
wherein the actuator comprises a coil, electromagnetically coupled to at least one of the membrane support structure or the substrate support structure, and
wherein D) comprises positioning the membrane support structure relative to the substrate support structure via an electromagnetic force.

28. A nanofabrication method, comprising:
A) providing a target substrate on a substrate support structure;
B) disposing a pre-formed pliable membrane onto the target substrate, wherein the pre-formed pliable membrane has an edge, a first surface, a second surface, and a thickness from about 100 nm to about 1 μm and is patterned to selectively transmit incident radiation;
C) coupling the edge of the pre-formed pliable membrane to a membrane support structure via at least one anchor point, the membrane support structure holding the pre-formed pliable membrane such that the second surface of the pre-formed pliable membrane is opposite the target substrate;
D) positioning the membrane support structure relative to the substrate support structure with an actuator operably coupled to at least one of the membrane support structure or the substrate support structure; and
E) irradiating the pre-formed pliable membrane so as to selectively irradiate a surface of the target substrate,
wherein the actuator comprises a magnet, electromagnetically coupled to at least one of the membrane support structure or the substrate support structure, and
wherein D) comprises positioning the membrane support structure relative to the substrate support structure via a magnetic force.

\* \* \* \* \*